(12) United States Patent
Koc

(10) Patent No.: US 11,843,330 B2
(45) Date of Patent: Dec. 12, 2023

(54) METHOD FOR OPERATING AN ELECTROMECHANICAL ELEMENT, ACTUATOR, DRIVE DEVICE AND MOTOR

(71) Applicant: PHYSIK INSTRUMENTE (PI) GMBH & CO. KG, Karlsruhe (DE)

(72) Inventor: Burhanettin Koc, Ettlingen (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 236 days.

(21) Appl. No.: 17/436,639

(22) PCT Filed: Mar. 4, 2020

(86) PCT No.: PCT/EP2020/055668
§ 371 (c)(1),
(2) Date: May 9, 2022

(87) PCT Pub. No.: WO2020/178320
PCT Pub. Date: Sep. 10, 2020

(65) Prior Publication Data
US 2022/0271687 A1      Aug. 25, 2022

(30) Foreign Application Priority Data

Mar. 6, 2019   (DE) .................... 10 2019 001 579.7

(51) Int. Cl.
*H02N 2/06*   (2006.01)
*H02N 2/02*   (2006.01)

(52) U.S. Cl.
CPC ............. *H02N 2/062* (2013.01); *H02N 2/025* (2013.01)

(58) Field of Classification Search
CPC ...... H02N 2/025; H02N 2/002; H02N 2/0025; H02N 2/006; H02N 2/026; H02N 2/067; H10N 30/50
See application file for complete search history.

(56) References Cited

U.S. PATENT DOCUMENTS

| 2008/0094677 | A1  | 4/2008  | Mizoguchi |
| 2012/0293577 | A1  | 11/2012 | Kyoso et al. |
| 2020/0204088 | A1* | 6/2020  | Koc ................ H02N 2/025 |

FOREIGN PATENT DOCUMENTS

| DE | 102019001579 B3 | 1/2020 |
| DE | 102019001519 A1 | 9/2020 |
| JP | 2012147510 A    | 8/2012 |

OTHER PUBLICATIONS

Written Opinion with regard to PCT/EP2020/055668 dated May 15, 2020.
(Continued)

*Primary Examiner* — Emily P Pham
(74) *Attorney, Agent, or Firm* — The Juhasz Law Firm

(57) ABSTRACT

A method for operating an electromechanical element, comprising the following steps: by controlling a first control section which is deformable by an electrical voltage by a first voltage signal generation of adjusting movements of a friction element which is arranged on the electromechanical element and which is provided for frictional contact with an element to be driven, controlling of a second control section which is deformable by an electrical voltage by a second voltage signal, which comprises a signal section, the frequency of which compared to the first voltage signal is by a factor, an actuator, a drive device with an actuator and a motor with a drive device and an element to be driven.

18 Claims, 14 Drawing Sheets

(56) References Cited

OTHER PUBLICATIONS

Figure 1:
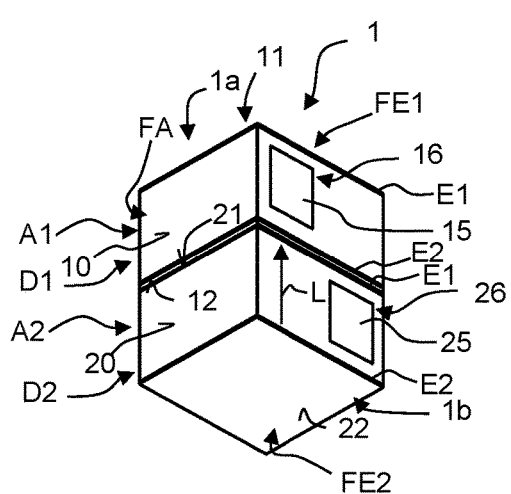

English Abstract for DE102019001519 retrieved on Espacenet on May 20, 2022.
English Abstract for JP2012147510 retrieved on Espacenet on May 5, 2022.
English Abstract for DE102019001579 retrieved on Espacenet on May 5, 2022.

* cited by examiner

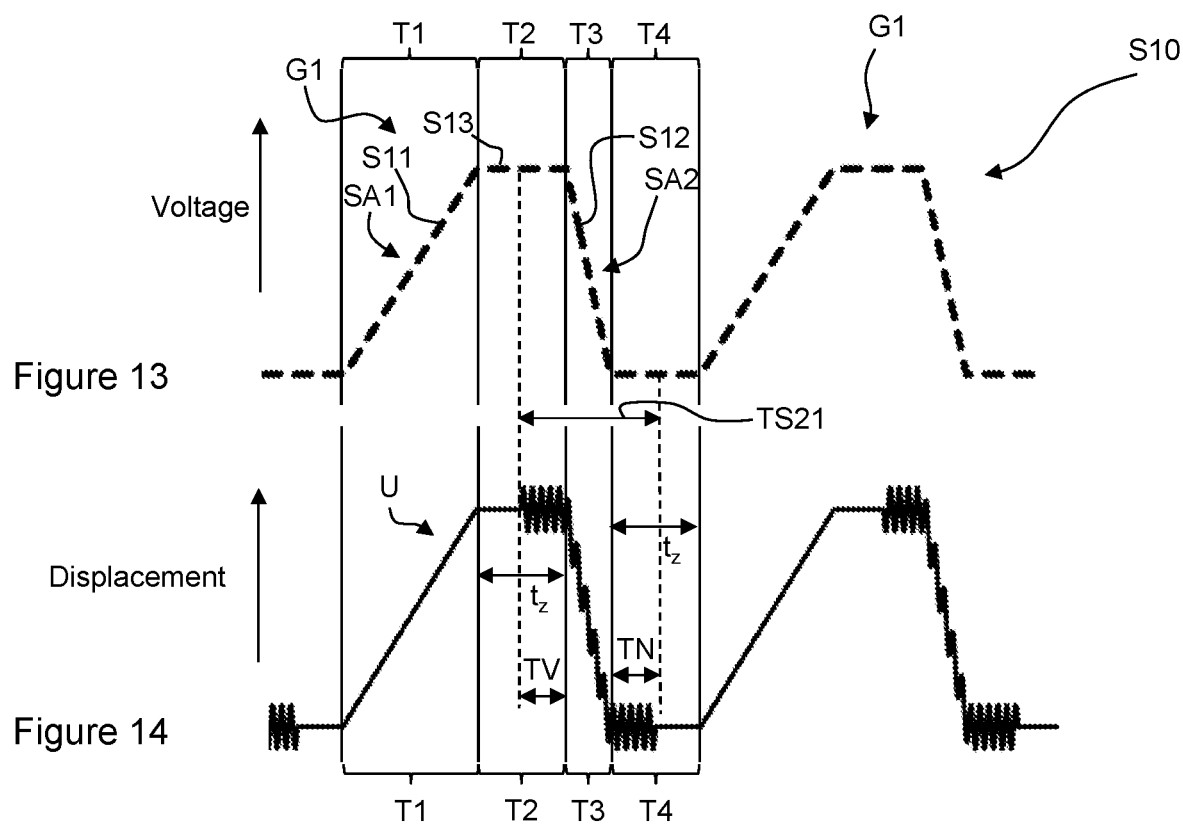

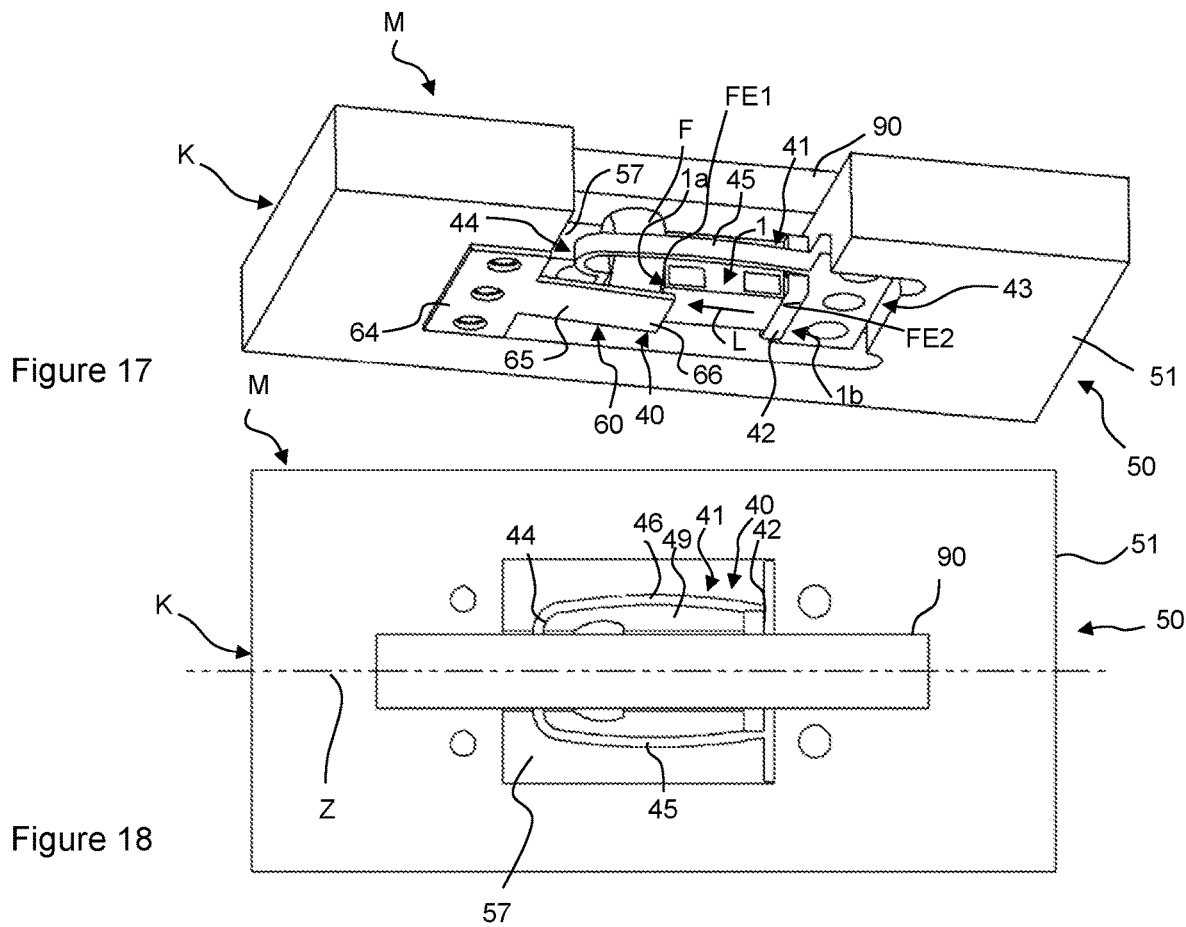
Figure 17
Figure 18
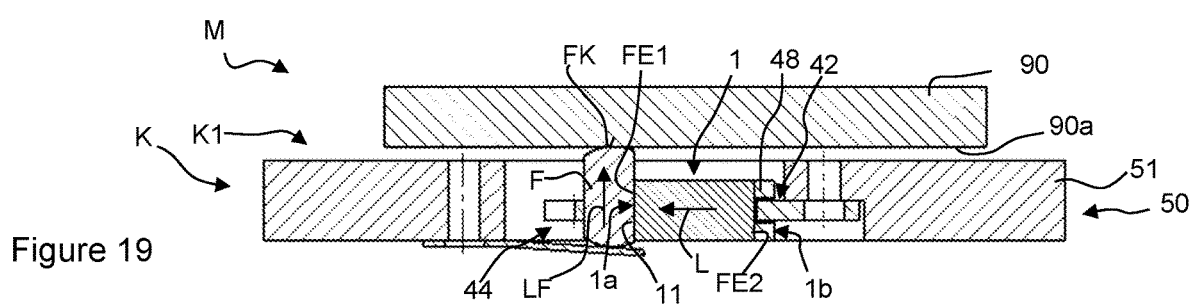
Figure 19

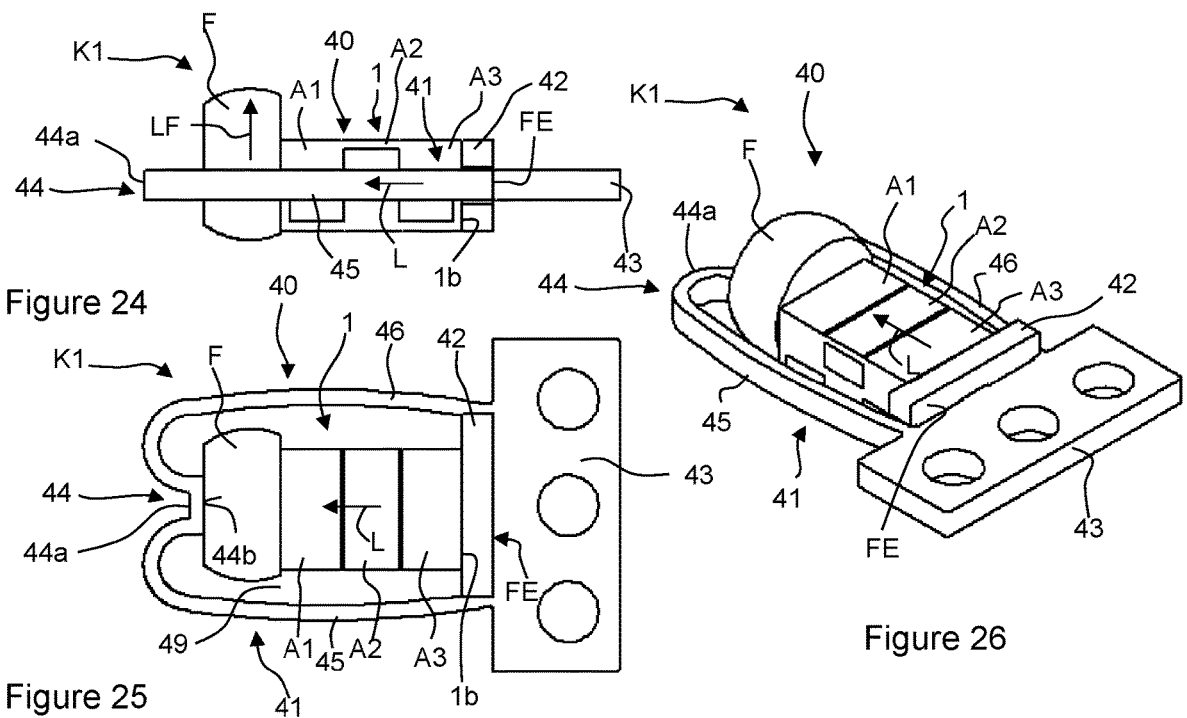

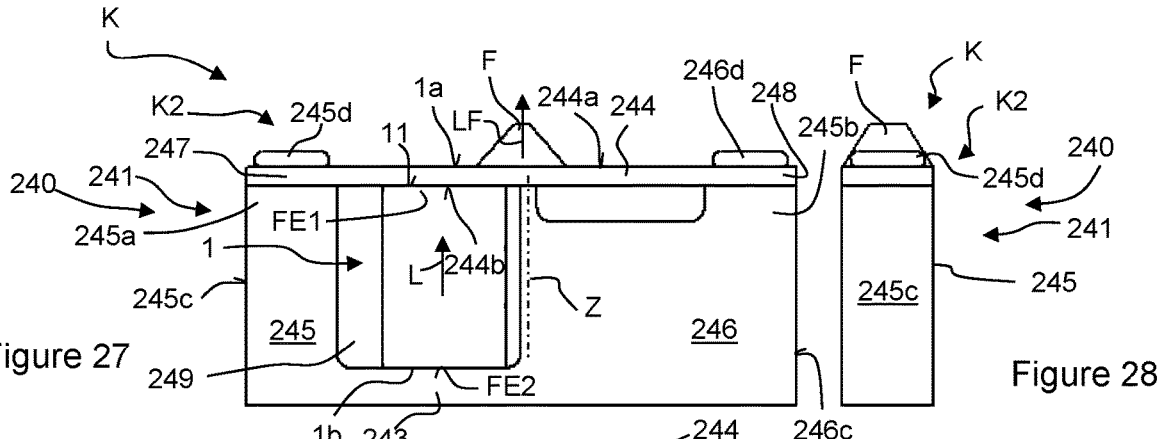
Figure 27  Figure 28
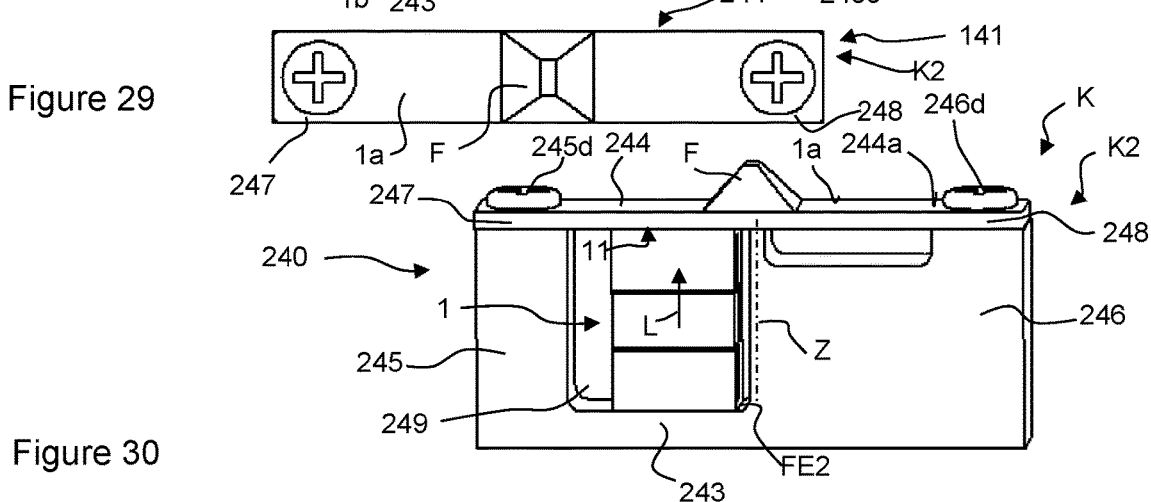
Figure 29
Figure 30
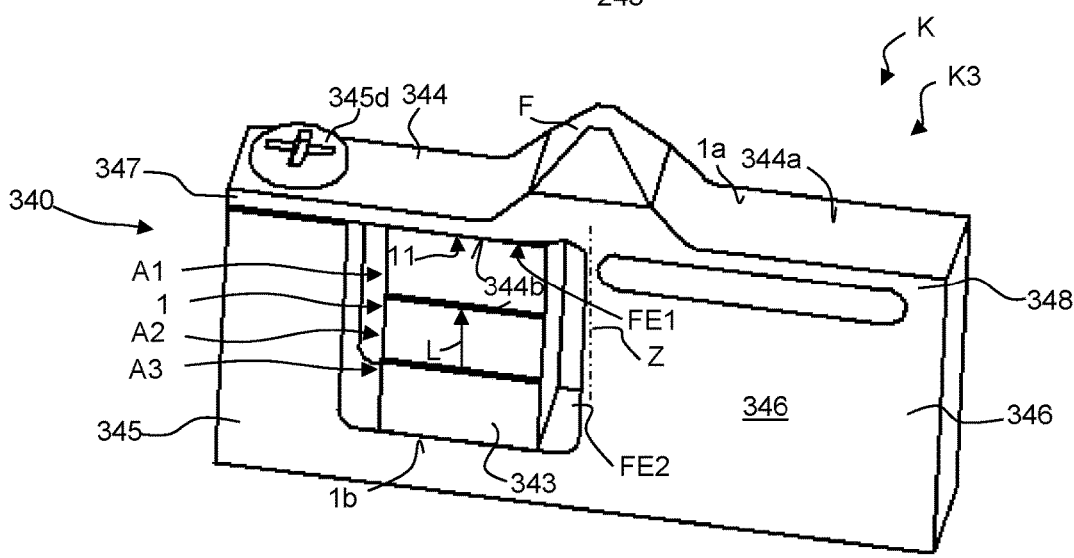
Figure 31

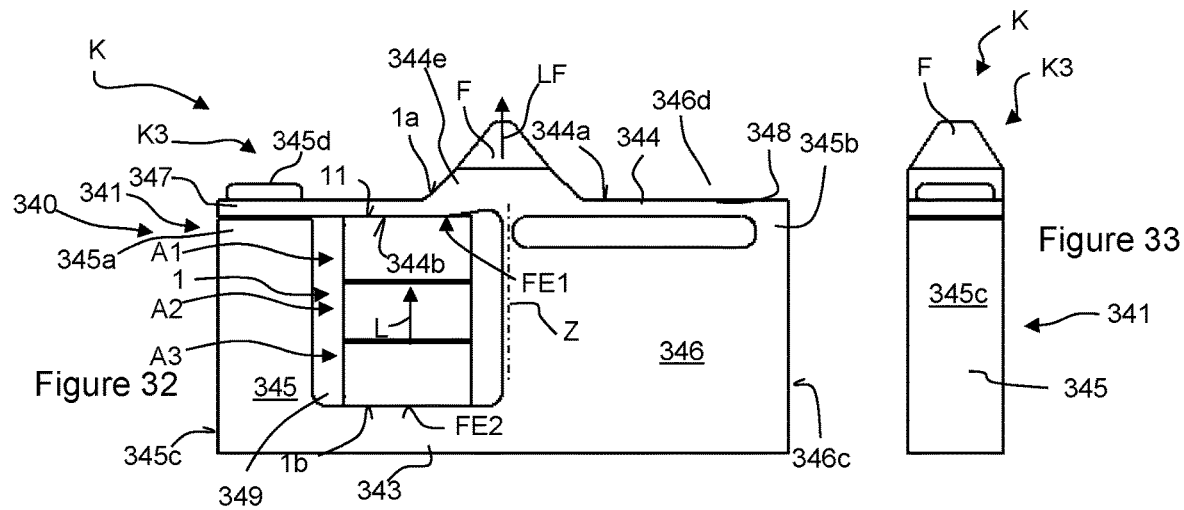
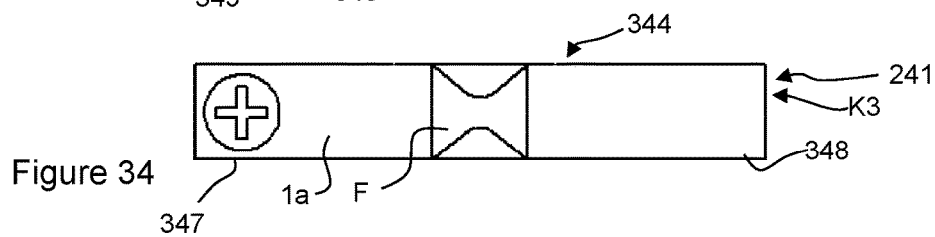
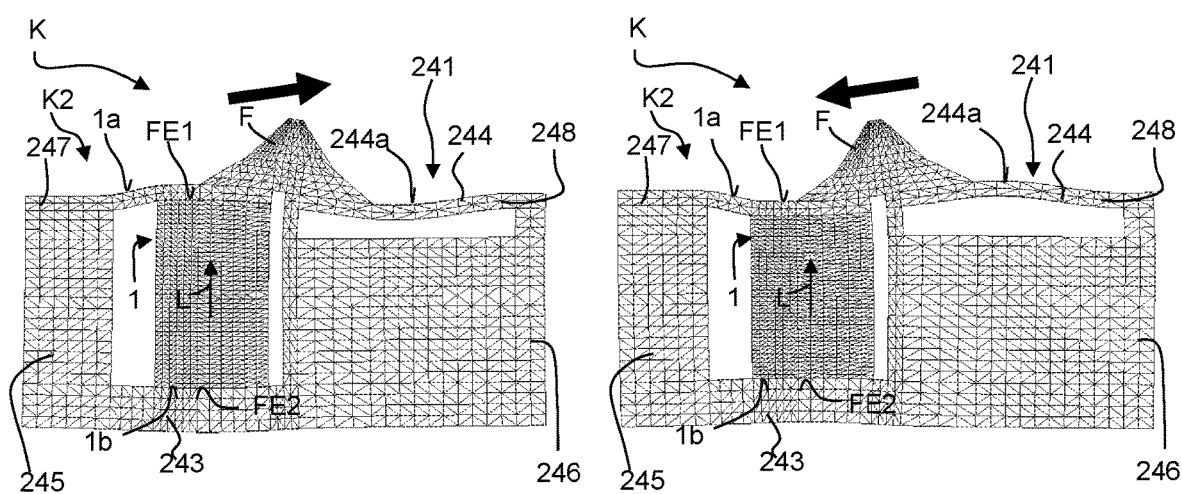
Figure 35          Figure 36

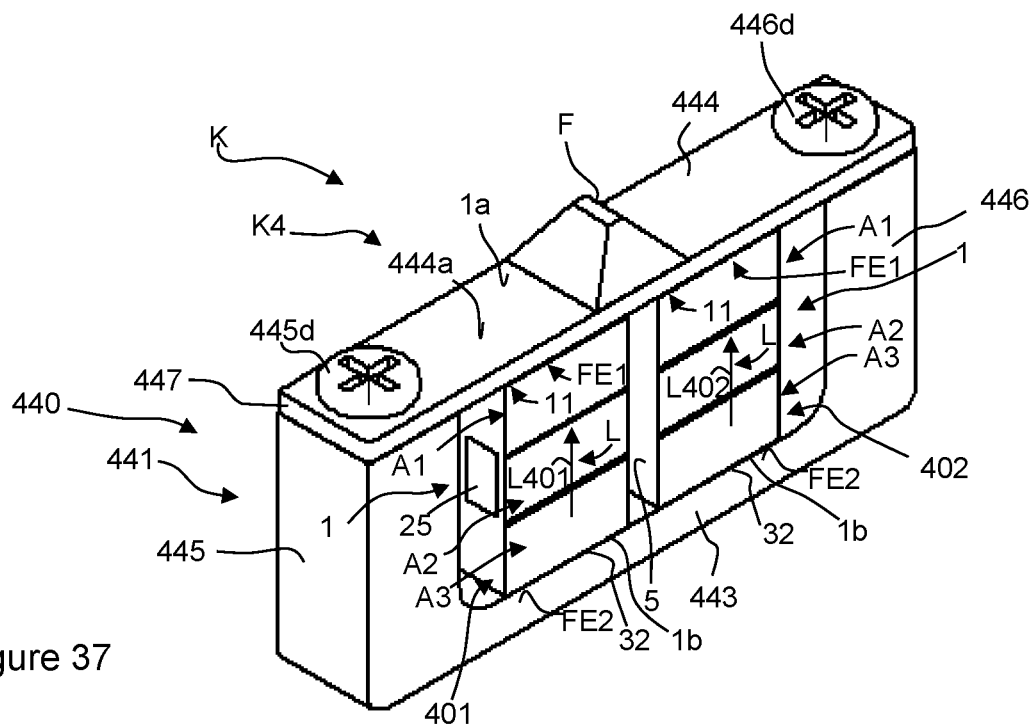
Figure 37
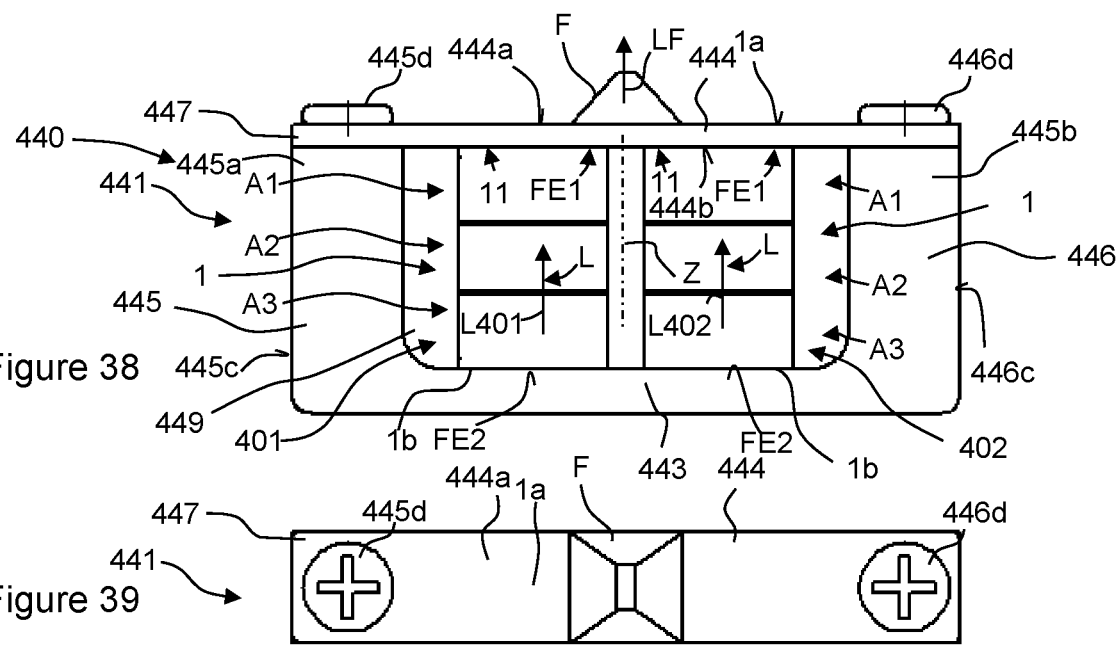
Figure 38
Figure 39

METHOD FOR OPERATING AN ELECTROMECHANICAL ELEMENT, ACTUATOR, DRIVE DEVICE AND MOTOR

The invention relates to a method for operating an electromechanical element, an actuator, a drive device with an actuator and a motor with a drive device and an element to be driven.

JP 2012 147510 A discloses a drive device with a stationary mounted first actuator and a second actuator which is located on the first actuator and is provided for contact with an element to be driven. The deformation directions of the two actuators are perpendicular to one another. The first actuator is subjected to a symmetrical triangle voltage. In the increasing or decreasing range, the second actuator is subjected to a high-frequency voltage in order to be able to effect with the vibrations which are generated thereby in the second actuator or at the interface between the second actuator and the element to be driven in this time range a reduction of the friction coefficients between the second actuator and the element to be driven, so that a sliding relative movement between the second actuator and the element to be driven can be realized in the relevant time range (slip phase), while in the respective other time range of the triangle voltage in which the high-frequency voltage is not applied to the second actuator, the coefficient of friction between the second actuator and the element to be driven is not reduced and is dimensioned such that due to the prevailing friction (i.e. static friction) the element to be driven follows the movement of the second actuator caused by the first actuator (stick phase).

The object of the invention is to provide a method for operating an electromechanical element, an actuator, a drive device with such an actuator and a motor with such a drive device, with which an element to be driven can be positioned with a predetermined accuracy.

This object is achieved with the features of the independent claims. Further embodiments are specified in the subclaims that refer back to these in each case.

According to the invention, a method is provided which comprises the following steps:
  by controlling a first control section which is deformable by an electrical voltage with a first voltage signal generation of adjusting movements of a friction element which is arranged on the electromechanical element and which is provided for frictional contact with an element to be driven, wherein the first voltage signal comprises a plurality of signal flanks which rise according to absolute amount and signal flanks which decrease according to absolute amount over time, wherein the increasing signal flanks and the decreasing signal flanks which alternate with each other in terms of time, wherein after an increasing signal flank and before a subsequent decreasing signal flank, or vice versa, an intermediate signal section with a non-zero time interval which differs over time from the shape of the signal flanks and preferably comprise a time-dependent gradient,
  controlling of a second control section which is deformable by an electrical voltage with a second voltage signal, which comprises a signal section, the frequency of which compared to the first voltage signal is by a factor of at least 10 higher and begins in terms of time within the time interval tz of a signal intermediate section of the first voltage signal and extends at least partially over the signal flank which in terms of time follows the signal intermediate section.

In particular, the invention relates to a method for operating an electromechanical element or an actuator.

In the embodiments of the method according to the invention, it can be provided that the signal intermediate section comprises a time-dependent gradient, which amounts to a maximum of 10 degrees.

In the embodiments of the method according to the invention, it can be provided that the signal section of the second voltage signal begins after at least 10% and at most 90% of the time interval tz of the signal intermediate section has elapsed or 50% of the time interval before the end of the same.

In the embodiments of the method according to the invention, it can be provided that the signal segment of the second voltage signal extends into an adjacent and temporally subsequent intermediate section and within its time interval tz or ends until its end.

In the embodiments of the method according to the invention, it can be provided that the signal section of the second voltage signal is sinusoidal.

In the embodiments of the method according to the invention, it can be provided that the maximum amplitude of the signal section of the second voltage signal is at most 50% of the maximum amplitude of the first voltage signal.

In the embodiments of the method according to the invention, it can be provided
  that the control of the first control section is a simultaneous control of a plurality of first control sub-sections with the first voltage signal, wherein the first control sub-sections form the first control section and are located one behind the other in the longitudinal direction,
  that the control of the second control section is a simultaneous control of several second control sub-sections with the second voltage signal, wherein the second control sub-sections form the second control section and are located one behind the other in the longitudinal direction.

In the embodiments of the method according to the invention, it can be provided that, simultaneously with the control of the first control section, a third control section which is deformable by an electrical voltage is controlled with the first voltage signal, wherein the third control section is arranged such that the second control section is located between the first and the third control section.

In the embodiments of the method according to the invention, it can be provided that the control of the third control section is a simultaneous control of a plurality of third control sub-sections with the first voltage signal, wherein the third control sub-sections form the third control section and are located one behind the other in the longitudinal direction.

According to the invention, an actuator is provided which comprises:
  a first control section which extends in a longitudinal direction and is deformable by an electrical voltage and comprises: a first deformation body, which is delimited by a first outer surface and two end faces which are lying opposite to each other, between which the first outer surface extends along the longitudinal direction, and two actuation electrodes which extend transversely to the longitudinal direction electrodes, wherein one actuation electrode acts as an excitation electrode and is disposed at the first end face and wherein another actuation electrode acts as a common electrode and is disposed at the second end face, a second control section which extends in a longitudinal direction and is deformable by an electrical voltage and comprises: a second deformation body, which is disposed in the longitudinal direction at the first deformation body, wherein the second deformation body is delimited by a second outer surface and two end faces which are lying opposite to each other, between which the first outer surface extends along the longitudinal direction, and two actuation electrodes which extend transversely to the longitudinal direction electrodes, wherein one actuation electrode acts as an excitation electrode and is disposed at the first end face and wherein another actuation electrode acts as a common electrode and is disposed at the second end face, a first control electrode which is disposed at a first connection section of the first outer surface and which is electrically connected to the excitation electrode of the first control section, a second control electrode which is electrically separated from the first control electrode, which is disposed at a second connection section of the second outer surface and which is electrically connected to the excitation electrode of the second control section, a reference electrode which is disposed at the first outer surface and the second outer surface and separated from the first control electrode and separated from the second control electrode and which is electrically connected to the common electrodes of the first and the second deformation body.

The actuator according to the invention is particularly suitable for using an embodiment of the method according to the invention. It can also be provided that the actuator is realized to carry out the method according to the invention.

In the embodiments of the actuator according to the invention, it can be provided that the actuator furthermore comprises:

a third control section which extends in a longitudinal direction and is deformable by an electrical voltage and which is located at a side of the second control section, wherein this side is located opposite of the side of the first control section with respect to the longitudinal direction, and wherein the third control section comprises:

a third deformation body, which is delimited by a third outer surface and two end faces which are lying opposite to each other, between which the third outer surface extends along the longitudinal direction, and two actuation electrodes which extend transversely to the longitudinal direction, wherein one actuation electrode acts as an excitation electrode and is disposed at the first end face and wherein another actuation electrode acts as a common electrode and is disposed at the second end face, and a third control electrode which is disposed at a third outer surface of the third connection section of the is arranged and which is electrically connected to the excitation electrode of the third control section, wherein the reference electrode is additionally disposed at the third outer surface of the third deformation body and separated from the third control electrode and separated from the second control electrode and which is electrically connected to the common electrode of the third deformation body.

In the embodiments of the actuator according to the invention, the third control electrode can be formed in one piece with the first control electrode.

In the embodiments of the actuator according to the invention, at least one of the control sections can be formed of a sequence of several control sub-sections, wherein each of the control sub-sections is formed of a plate-shaped excitation electrode which extends transversely to the longitudinal direction, of a plate-shaped common electrode which extends transversely to the longitudinal direction and of a layer which is located between these in the longitudinal direction and is made of an electromechanical, in particular piezoelectric material, wherein the layer (P) is respectively located between the excitation electrode and the common electrode.

In the embodiments of the actuator according to the invention, at least one of the deformation bodies can be formed from a homogeneous and electrically deformable material.

In the embodiments of the actuator according to the invention, a friction element can be arranged on an end section of the first control section or of the second control section oriented in the longitudinal direction.

According to the invention, a drive device with an embodiment of the actuator according to the invention and with a holding device is provided, wherein the holding device is formed in an at least partially elastic manner, wherein the actuator is held in the holding device and preferably clamped therein.

In the embodiments of the drive device according to the invention, the holding device can be realized as a tensioning frame surrounding the actuator at least in sections.

According to the invention, a motor with a drive device according to an embodiment of the invention and with an element to be driven is provided, which is supported so as to be movable relative to the drive device and which is in frictional contact with a friction element which is disposed at the actuator.

Figure 2:
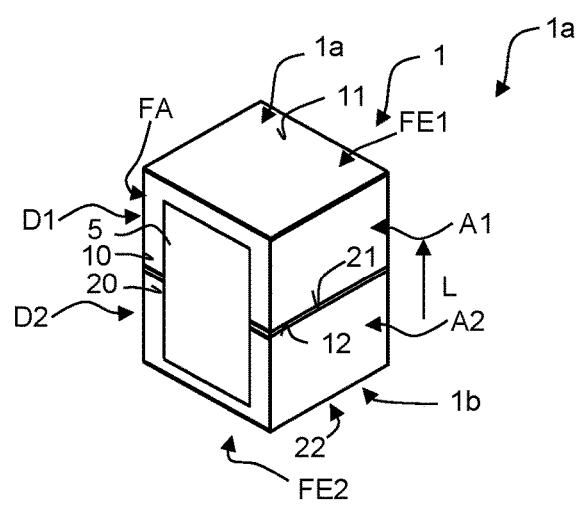
Figure 3:
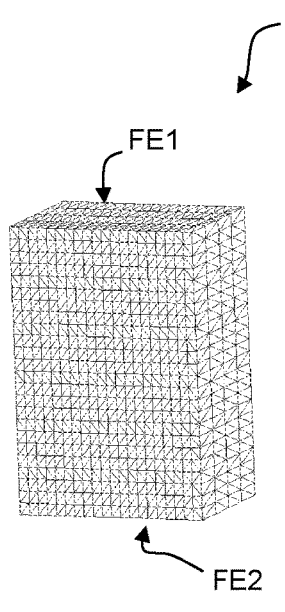
Figure 4:
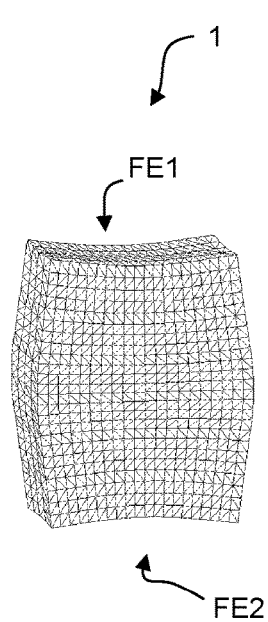
Figure 5:
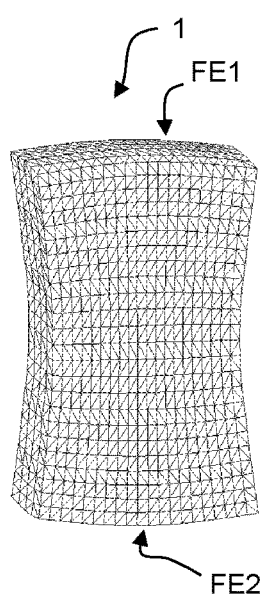
Figure 6:
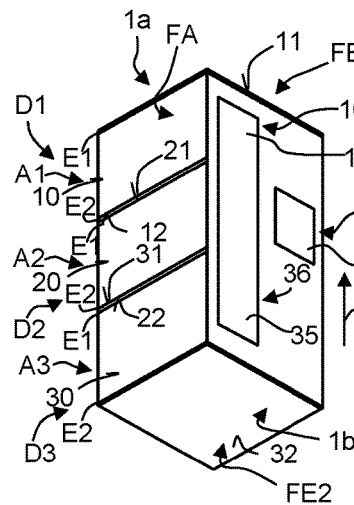
Figure 7:
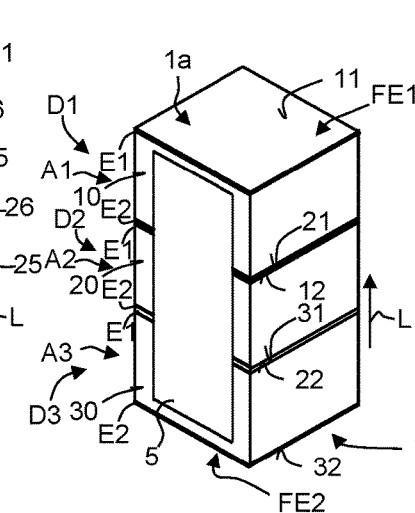
Figure 8:
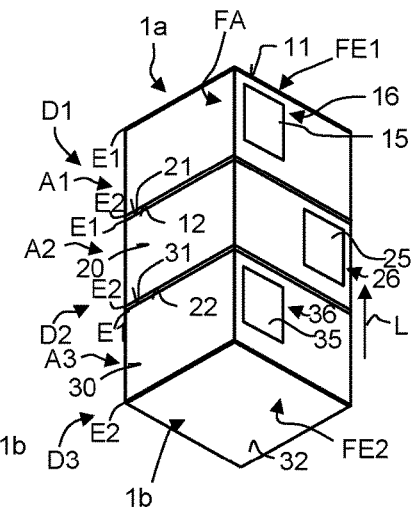
Figure 9:
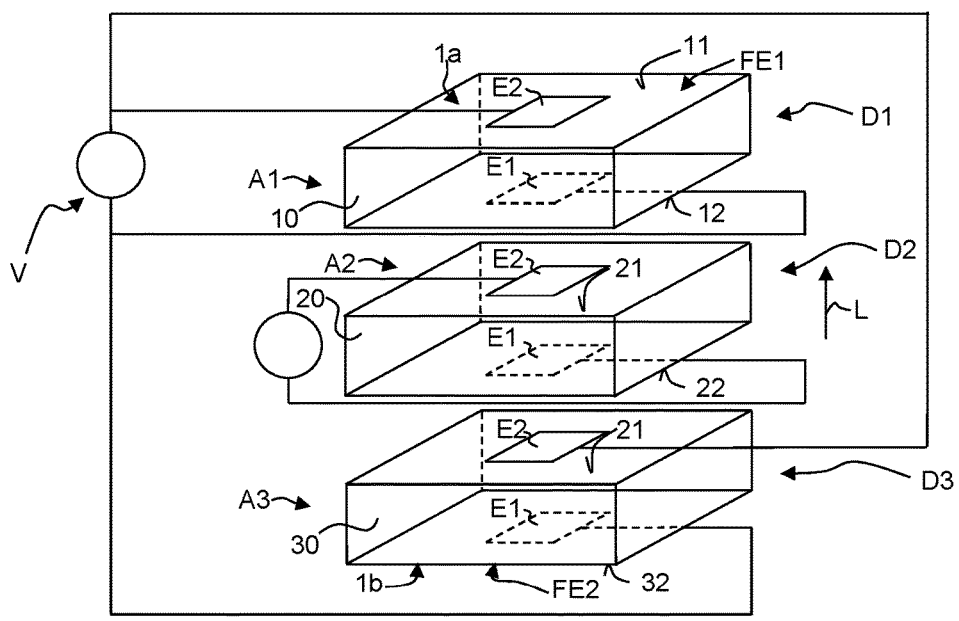
Figure 10:
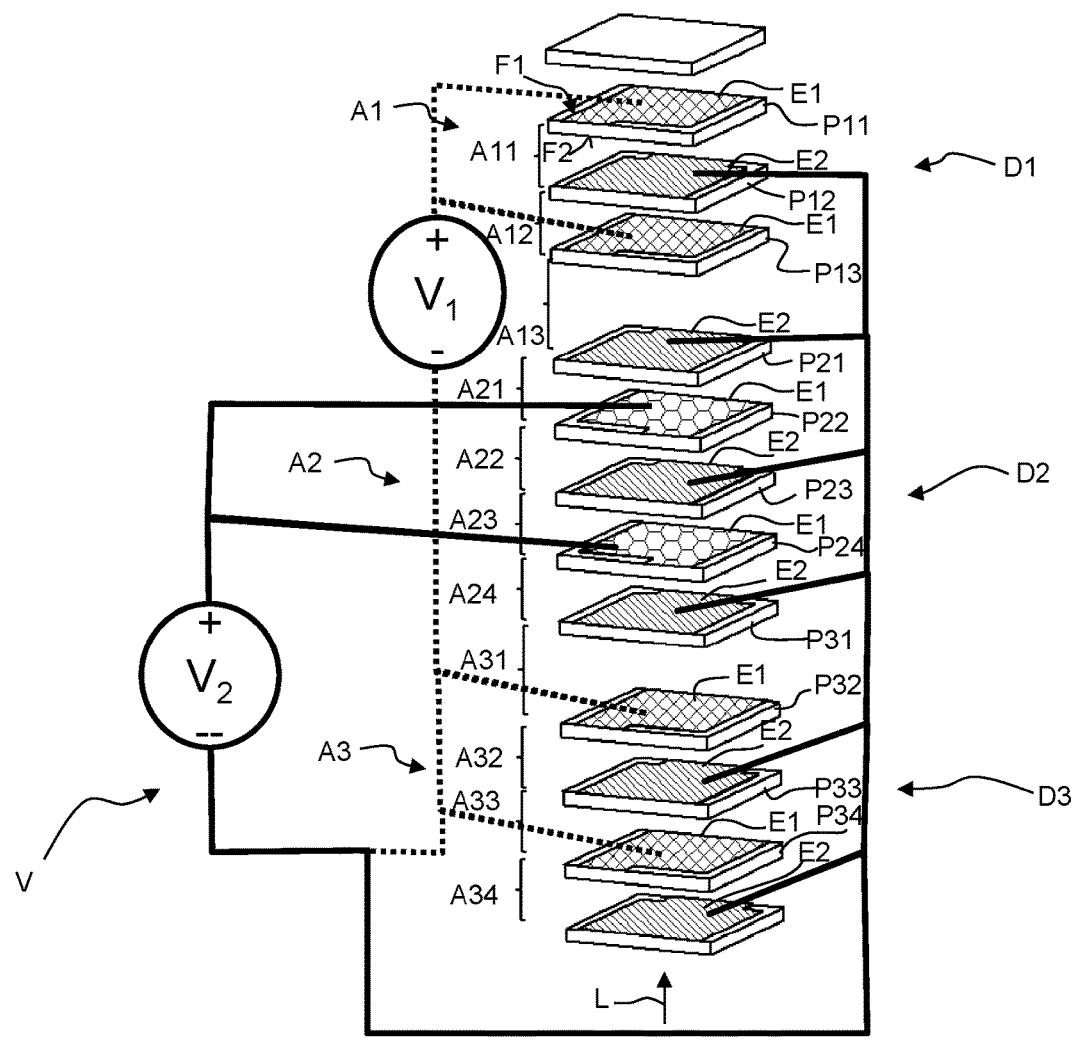
Figure 11:
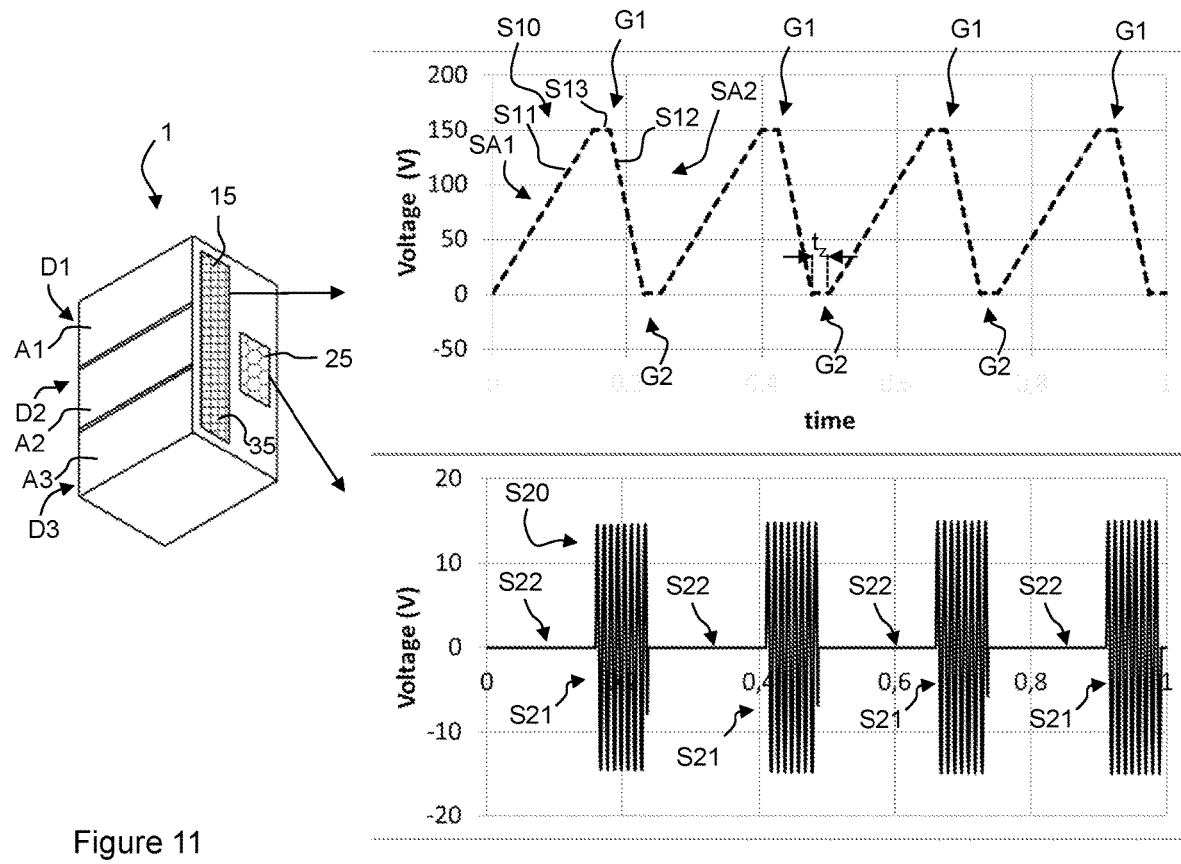
Figure 12:
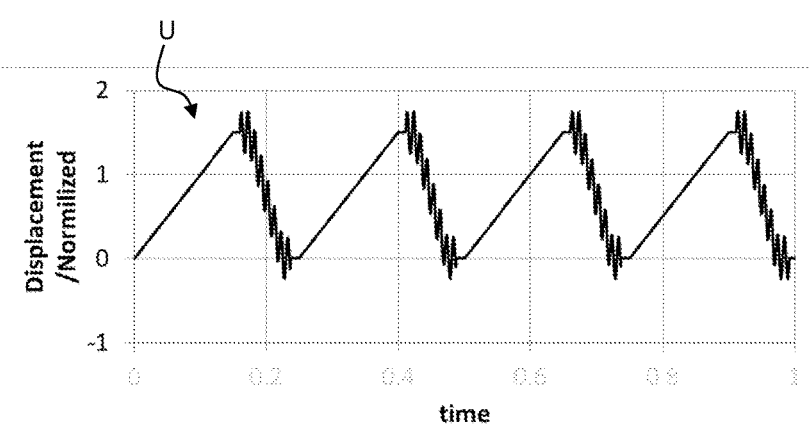
Figure 15:
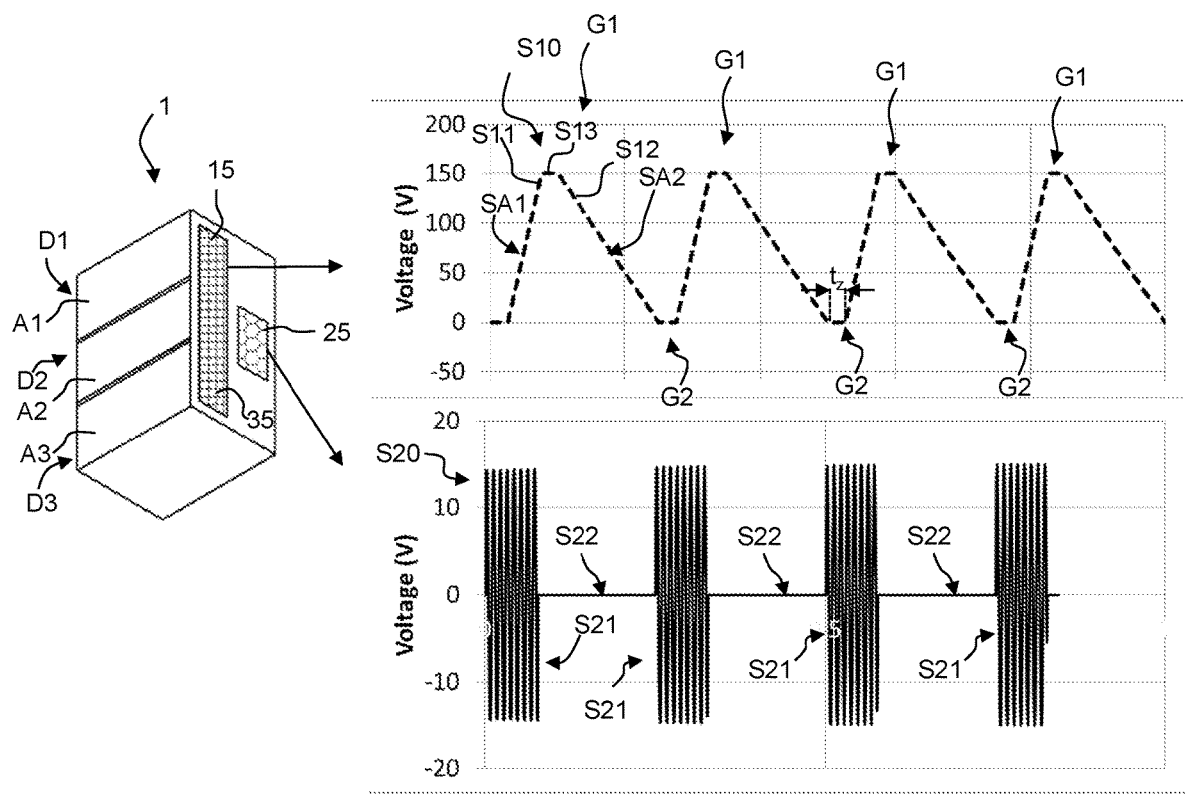
Figure 16:
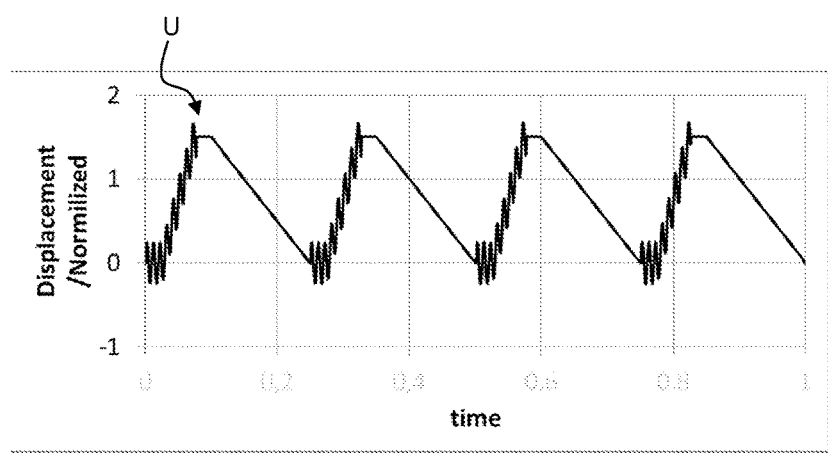
Figure 20:
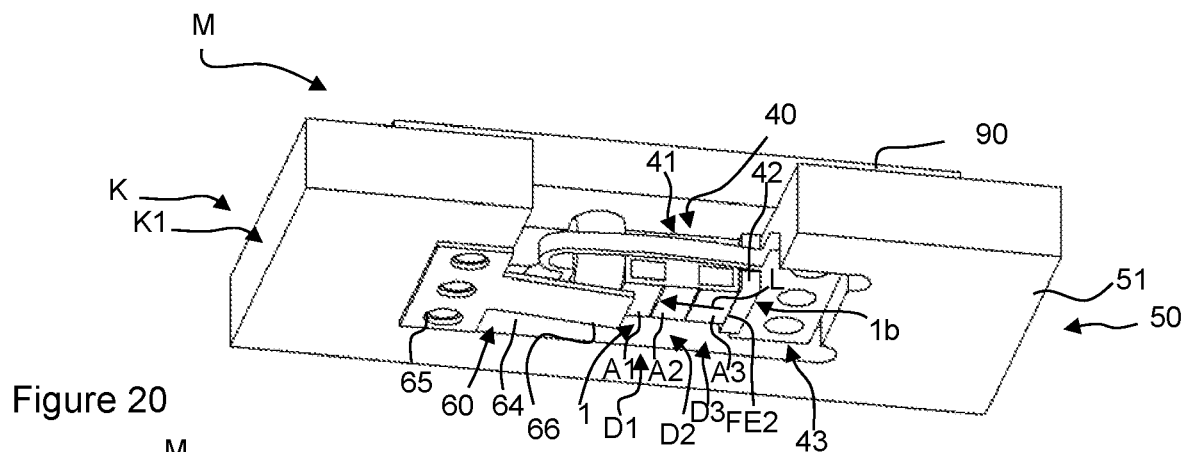
Figure 21:
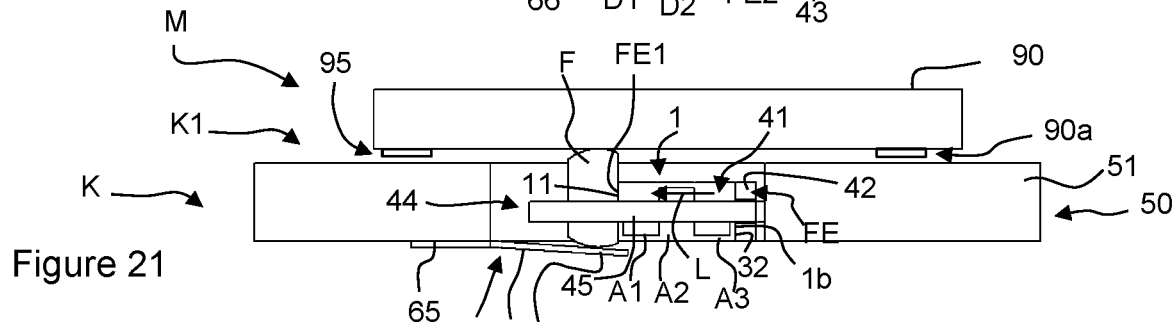
Figure 22:
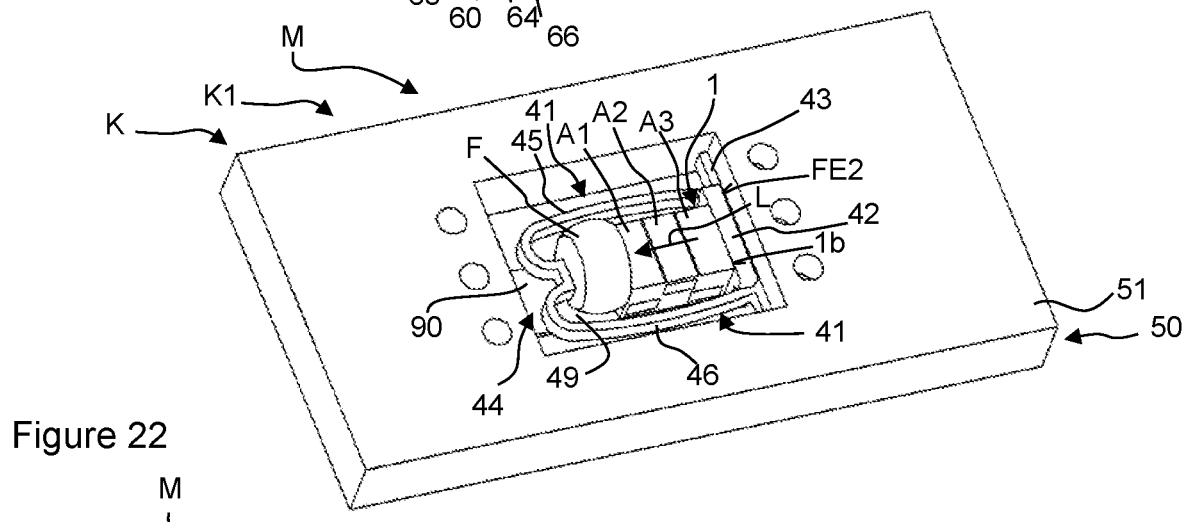
Figure 23:
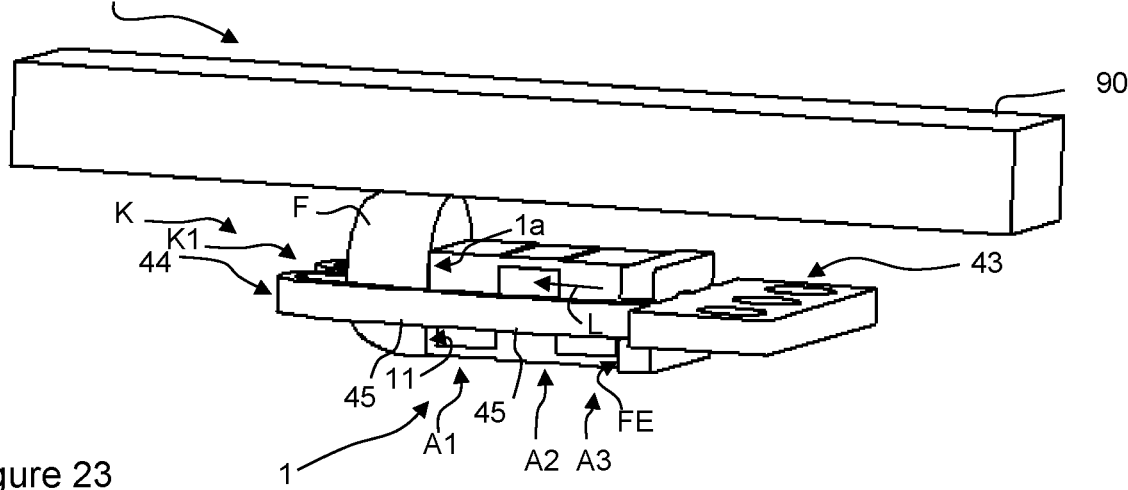
Figure 40:
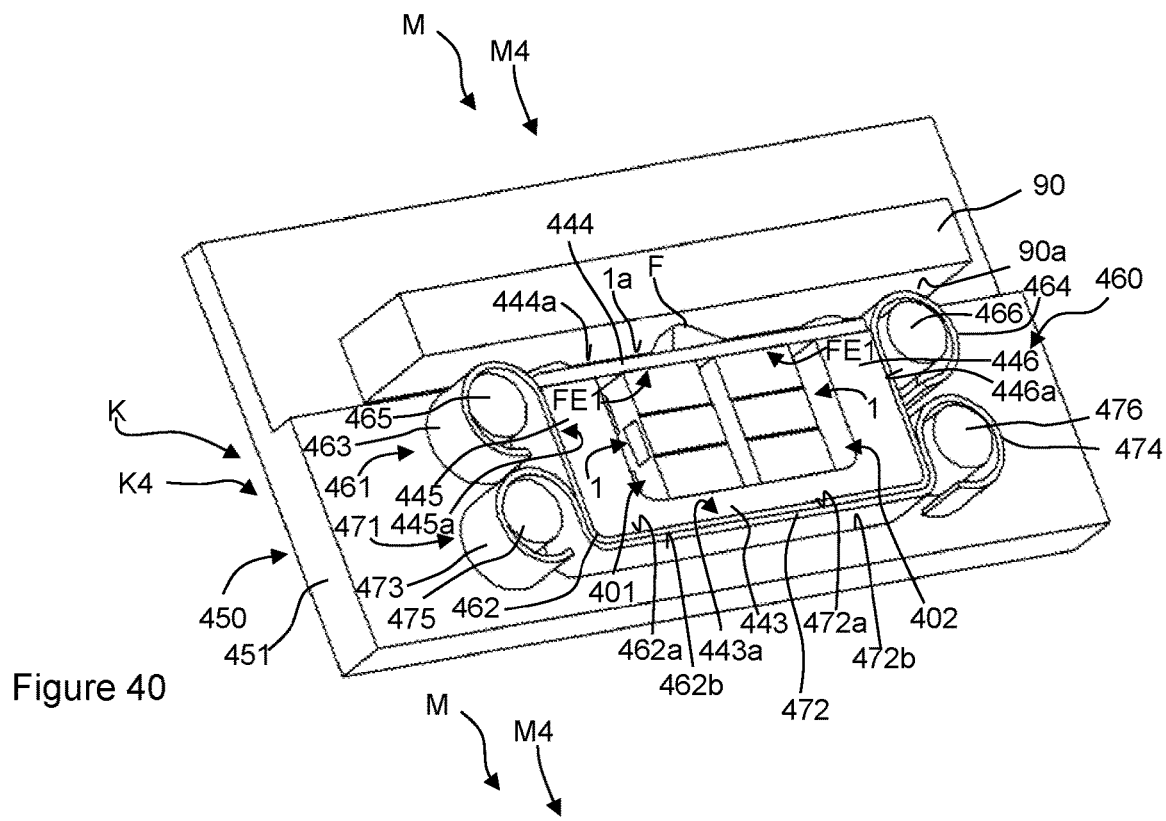
Figure 41:
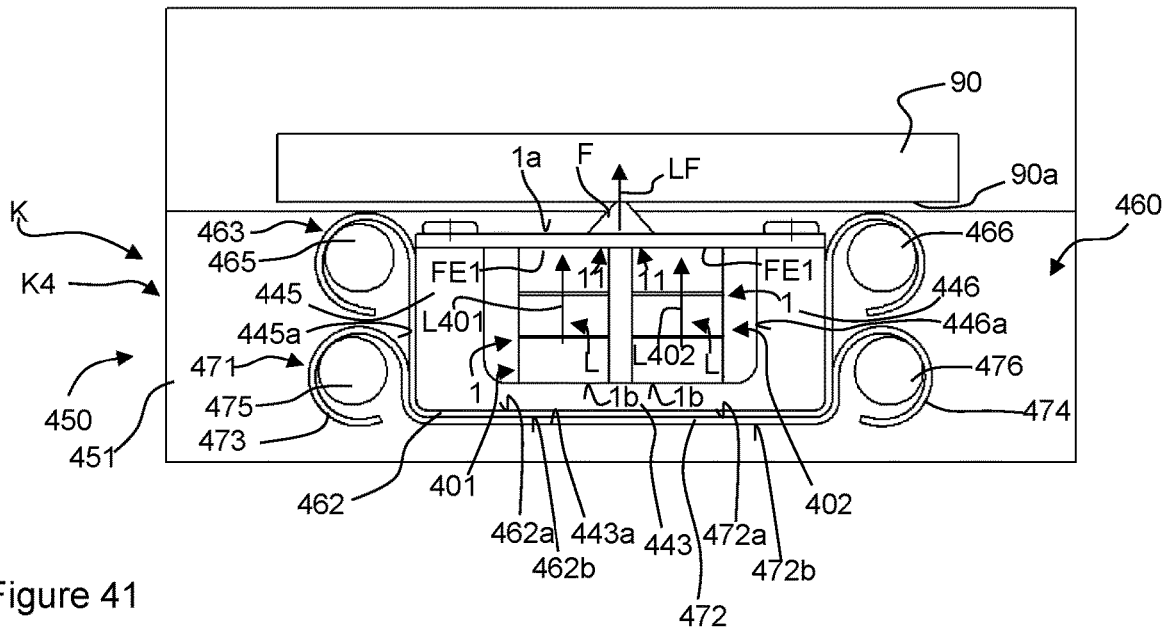
Figure 42:
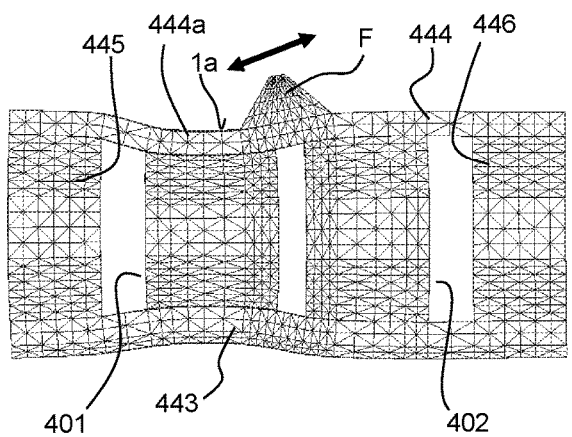
Figure 43:
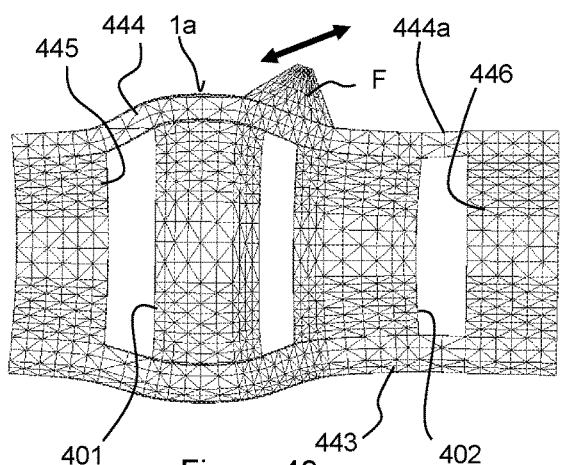
Figure 44:
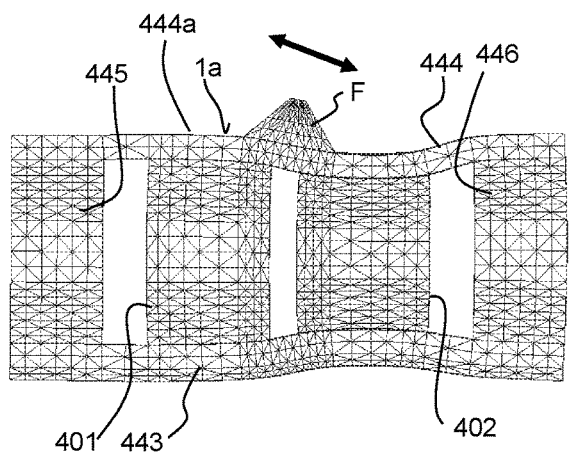
Figure 45:
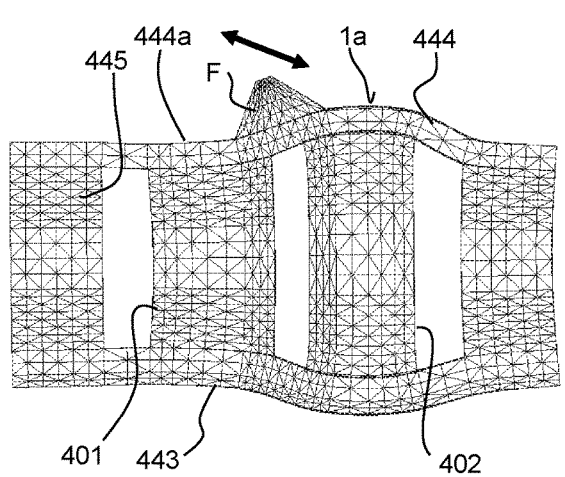

The invention is described below with reference to the accompanying figures, wherein:

FIG. 1 shows a perspective illustration of an embodiment of the actuator according to the invention, which comprises a group of two control sections each with a deformation body, which comprises two control electrodes and a reference electrode, wherein the two control electrodes are shown in the figure, FIG. 2 shows a further perspective illustration of the embodiment of the actuator of FIG. 1 based on a viewing direction which is directed opposite to the viewing direction of FIG. 2, wherein FIG. 2 shows the reference electrode, FIG. 3 shows a FEM model which relates to the two deformation bodies of FIG. 1, shown as a uniform deformation block in a non-operating state, FIG. 4 shows the FEM simulation of a contracted state of the deformation block according to FIG. 3, wherein the contracted state relates to its longitudinal direction, FIG. 5 shows the FEM simulation of an expanded state of the deformation block according to FIG. 3, wherein the expanded state relates to its longitudinal direction, FIG. 6 shows a perspective illustration of an embodiment of the actuator according to the invention which comprises a group of three control sections each with a deformation body which comprises two control electrodes and a reference electrode, wherein in FIG. 6 the two control electrodes are shown, FIG. 7 shows a further perspective illustration of the embodiment of the actuator of FIG. 6 based on a viewing direction which is directed opposite to the viewing direction of FIG. 1, wherein in FIG. 7 the reference electrode is shown, FIG. 8 shows a perspective illustration of a further embodiment of the actuator according to the invention, which is a variant of the embodiment of the actuator of FIG. 6, which comprises a group of three control electrodes and a reference electrode, FIG. 9 shows a schematic functional illustration of a control device for an embodiment of the actuator with three control sections, the actuator is shown in an exploded view, wherein the functional view shows the control by two voltage signals, FIG. 10 shows a schematic functional illustration of a control device for a further embodiment of the actuator according to FIG. 6 or FIG. 8 as well as this actuator, wherein the actuator is shown in an exploded view, wherein the functional illustration shows the control by two voltage signals, FIG. 11 shows two voltage-time diagrams for the illustration of a first and a second voltage signal with which the actuator according to the embodiment of FIG. 6 or FIG. 8 is operated according to a method of the invention, FIG. 12 is a voltage-time diagram in which a sum voltage signal is shown that results from the superposition of the first and the second voltage signal of FIG. 11, FIG. 13 shows a voltage-time diagram in which the first voltage signal of FIG. 11 together with time segments is shown, FIG. 14 shows a voltage-time diagram in which the sum voltage signal of FIG. 12 together with time segments is shown, FIG. 15 shows two voltage-time diagrams for the illustration of a first and a second voltage signal, which differ from the voltage signals of FIG. 11, FIG. 16 shows a voltage-time diagram in which a sum voltage signal is shown which results from the superposition of the first and second voltage signals of FIG. 15, FIG. 17 shows a perspective illustration of an embodiment of a motor according to the invention with an actuator according to the invention, a holding device, a friction element and a driven element, FIG. 18 is a plan view of the motor according to FIG. 17, FIG. 19 shows a sectional view of the motor according to FIG. 17, FIG. 20 shows a perspective illustration of an embodiment of a motor according to the invention with an actuator according to FIG. 8, FIG. 21 shows a side view of the motor according to FIG. 20, FIG. 22 shows a perspective illustration of an embodiment of the motor of FIG. 20 in a view from below from the direction of the holding device, FIG. 23 shows a perspective illustration of the embodiment of the drive device shown in FIGS. 20 to 22, wherein the element to be driven is additionally shown, FIG. 24 shows a side view of the embodiment of the drive device shown in FIGS. 20 to 23, FIG. 25 shows a plan view of the embodiment of the drive device shown in FIGS. 20 to 23, FIG. 26 shows a perspective illustration of the embodiment of the drive device shown in FIGS. 20 to 23, FIG. 27 shows a side view of a further embodiment of the drive device according to the invention with an actuator and a holding device in which the actuator is integrated, wherein the drive device is in a neutral deformation state, FIG. 28 shows a further side view of the drive device of FIG. 27, wherein the drive device is in a neutral deformation state, FIG. 29 a plan view of the drive device of FIGS. 27 and 28, FIG. 30 shows a perspective illustration of a drive device with an actuator according to FIG. 8 and a holding device according to FIG. 27, wherein the drive device is in a neutral deformation state, FIG. 31 shows a perspective illustration of a further embodiment of the drive device according to the invention, the drive device having an actuator according to FIG. 8, FIG. 32 shows a side view of the drive device of FIG. 31, the drive device is in a neutral deformation state, FIG. 33 shows a further side view of the drive device of FIG. 31, FIG. 34 a top view of the drive device of FIG. 31, FIG. 35 shows a FEM simulation of a first deformation state of the drive device according to FIGS. 31 to 34, FIG. 36 shows an FEM simulation of a second deformation state of the drive device according to FIGS. 31 to 34, wherein the second deformation state is opposite or contrary to the first deformation state according to FIG. 35, FIG. 37 shows a perspective illustration of a further embodiment of the drive device, wherein the drive device comprises two actuators which lyg next to one another according to FIG. 8 and wherein the actuators are in a neutral deformation state, FIG. 38 shows a side view of the drive device of FIG. 37, FIG. 39 shows a top view of the drive device of FIG. 37, FIG. 40 shows a perspective illustration of an embodiment of the motor according to the invention with the embodiment of the drive device of FIG. 37, FIG. 41 is a side view of the embodiment of the motor of FIG. 40, FIG. 42 shows a FEM simulation of a first deformation state of the drive device according to FIG. 39 with regard to a first operating mode, FIG. 43 shows a FEM simulation of a second deformation state of the drive device according to FIG. 39 with regard to a first operating mode, wherein the second deformation state opposite or contrary to the deformation state of FIG. 31, FIG. 44 shows a FEM simulation of a first deformation state of the drive device according to FIG. 39 with regard to a second operating mode, FIG. 45 shows a FEM simulation of a second deformation state of the drive device according to FIG. 39 with regard to a second operating mode, wherein the second deformation state is opposite or contrary to the deformation state of Figure The actuator 1 according to the invention is formed from a group of at least two control sections A1 and A2, which each extend in a longitudinal direction L of the actuator 1 and, viewed in the longitudinal direction L, are arranged one behind the other. The actuator 1 is as realized as an electromechanical and preferably a piezoelectric element. The actuator 1 is delimited by an outer actuator outer surface FA and two actuator end faces FE1, FE2 which are oriented opposite to each other with respect to the longitudinal direction L and between which the actuator outer surface FA extends along the longitudinal direction L.

FIGS. 1 and 2 show an embodiment of the actuator 1 according to the invention, which comprises a group of only two control sections A1, A2, each of which extend in a longitudinal direction L of the actuator 1 and which, viewed in the longitudinal direction L, are arranged one behind the other.

The first control section A1 comprises a first deformation body D1, which is delimited by a first outer surface 10 and two end faces 11, 12 which are oriented opposite one another with respect to the longitudinal direction L and between which the first outer surface 10 extends along the longitudinal direction L, and at least two actuation electrodes E1, E2 which extend transversely to the longitudinal direction L. The end faces 11, 12 which are formed in the longitudinal direction L comprise a first end face 11 as an actuator end face FE1 and a second end face 12. In a functional aspect, based on the control function according to the invention, a first actuation electrode of the actuation electrodes E1, E2 is disposed as an excitation electrode E1 at the first end face 11 and at least one common electrode E2 is disposed at a second end face 12. Within the first deformation body D1, further actuation electrodes E1, E2, which extend transversely to the longitudinal direction and which are disposed in a distance from one another and between which electromechanical material is located can be arranged in order to realize a multilayer structure. In this case, due to the control provided according to the invention, an excitation electrode E1 and a common electrode E2 can be arranged at least in sections alternately, viewed in the longitudinal direction L, when starting from the first end face 11 to the second end face 12. In the embodiments described herein with a first end face 11, the same can be realized as a first actuator end face FE1.

The second control section A2 comprises a second deformation body D2, which is delimited by a second outer surface 20 and two end faces 21, 22 which are oriented opposite to one another in relation to the longitudinal direction L and between which the second outer surface 20 extends along the longitudinal direction L, and at least two actuation electrodes E1, E2 which extend transversely to the longitudinal direction L. The end faces 21, 22 comprise a first end face 21 and a second end face 22 as an actuator end face FE2. As with the first control section A1, in a functional aspect, based on the control function according to the invention, from the group of actuation electrodes E1, E2 a first electrode E1 with the function of an excitation electrode is disposed at the first end face 21 and at least one common electrode E2 is disposed at a second end face 22. Within the second deformation body D2, further actuation electrodes E1, E2 which extend transversely to the longitudinal direction and are spaced apart from each other, and intervening layers of electromechanical material, each of which lie between them in each case, may be arranged for realizing a multilayer structure. In this case, due to the control provided according to the invention an excitation electrode E1 and a common electrode E2 can be arranged at least in sections alternately, viewed in the longitudinal direction L, when starting from the first end face 11 to the second end face 12. The actuator 1 with the two control sections A1, A2 extends in the longitudinal direction L between the end faces 11, 22, which form the actuator end faces FE1 and FE1, respectively.

The actuator 1 of FIGS. 1 and 2 further comprises a first control electrode 15 and a second control electrode 25, both of which are external electrodes with respect to the control sections A1 and A1, respectively. The first drive electrode 15 is disposed on the first outer surface 10 and the second control electrode 25 is disposed on the second outer surface 20. The control electrodes 15, 25 are located on the outer surface of the actuator 1, electrically separated from one another. The first control electrode 15 is disposed on a first connection section 16 of the first outer surface 10 and is electrically connected to the at least one excitation electrode E1 of the first control section A1. The second control electrode 25 is disposed on a second connection section 26 of the second outer surface 20 and is electrically connected to the at least one excitation electrode E1 of the second control section A2. The connection sections 16 and 26 are disposed spaced apart from each other.

The actuator 1 further comprises a reference electrode 5, which is disposed on the first outer surface 10 of the first deformation body D1 and the second outer surface 20 of the second deformation body D2 and which extends at least partially over both outer surfaces 10, 20 or essentially over both outer surfaces 10, 20. The reference electrode 5 is therefore an external electrode with respect to the control sections A1, A2. The reference electrode 5 is electrically separated from the first control electrode 15 and of the second control electrode 25 and is electrically connected to the at least one common electrode E2 of the first and second deformation bodies D1 and D2.

Embodiments of the invention may comprise a friction element F, which is disposed at an actuation surface 1 *a* which is oriented in the longitudinal direction L and which takes over the deformation movements of the first end face 11 of the actuator 1 and transfers them to the friction element F.

For the embodiments of the actuator 1 that can be taken from FIGS. 17 to 26, the case friction element F is located on the first end face 11 of the first control section A1, so that the same is the actuation surface 1 *a*. The friction element F may directly or indirectly contact the first end face 11. In this context, "indirect" means that between the first end face 11 and the friction element F an intermediate layer or a structural component with an outer surface as actuation surface 1 *a* may be located, which is oriented along the orientation direction of the first end face 11 or along the longitudinal direction L and which receives a deformation of the first end face 11 of the actuator 1 and causes a change in position and location of the friction element F.

In the embodiment of FIGS. 17 to 26, seen in the longitudinal direction L, opposite to the actuation surface 1 *a*, a support plate 42 is arranged on the second actuator end face FE2, wherein the support plate 42 comprises a storage surface 1 *b* which is oriented along the actuator end face FE2. In other embodiments of the invention, the support surface 1 *b* can be the second actuator end face FE2 or for example the end face 22 or 32 itself or an outer surface of a layer located on or at the second end face 22 or 32 or a structural component located on the second end face 22 or 32, wherein the bearing surface 1*b* is oriented along the orientation direction of the first end face 11 or along the longitudinal direction L.

In the embodiments according to FIGS. 17 to 26, the friction element F extends in a longitudinal direction LF. The friction element F can be made of or consist of a hard and abrasion-resistant material. The material can in particular be made of or consist of a ceramic material, a metal or a plastic or a combination of these materials. The material is provided in such a way that with the same a frictional contact with the respective element to be driven can be realized.

FIG. 3 shows the FEM model for the combination of control sections A1, A2 according to FIGS. 1 and 2 as a deformation block which can be actuated and which is formed in a uniform manner, while FIGS. 4 and 5 illustrate different deformation states of such a deformation block. These deformation states of the deformation block can be realized in a dynamic sequence with appropriate control of the control electrodes 15 and 25 by means of electrical voltage signals with reference to a reference voltage applied to the reference electrode 5 in order to actuate the friction element F or to move it along a defined movement path or trajectory. The friction element F is provided to interact with a friction surface of an element 90 to be driven to interact and can move the element 90 to be driven relative to the actuator 1 when generating a dynamic sequence of the various deformation states according to FIGS. 4 and 5.

FIGS. 6 and 7 show a further embodiment of the actuator 1 according to the invention, which comprises a group of three control sections A1, A2, A3, wherein each of the control sections extends in a longitudinal direction L of the actuator 1 and wherein the control sections, viewed in the longitudinal direction L, are arranged one behind the other.

In this embodiment, the actuator 1 additionally comprises a third control section A3 which extends in a longitudinal direction and which is deformable by an electrical voltage, wherein the second control section A2 is located between the first control section A1 and the third control section A3, so that the control sections A1, A2 and A3 are located one behind the other as seen in the longitudinal direction L. The third control section A3 comprises: a third deformation body D3, which is delimited by a third outer surface 30, and by a first end face 31 and by a second end face 32 as a second actuator end face FE2, which is positioned opposite to the first end face 31 with respect to the longitudinal direction L, and by at least two actuation electrodes E1, E2 which extend transversely to the longitudinal direction. The third outer surface 30 extends between the end faces 31, 32 along the longitudinal direction L. The actuation electrodes E1, E2 are realized, due to the control provided according to the invention, by at least one excitation electrode E1, which is disposed on the first end face 31, and at least one common electrode E2, which is disposed on the second end face 32. Within the third deformation body D3, further actuation electrodes E1, E2, which extend transversely to the longitudinal direction and which are disposed in a distance from one another with a layer made of an electromechanical material located between the same in each case can be arranged in order to realize a multilayer structure. In this case, due to the control provided according to the invention, an excitation electrode E1 and a common electrode E2 can be disposed at least in sections alternately, viewed in the longitudinal direction L, when starting from the first end face 11 to the second end face 12.

The embodiment of the actuator 1 according to FIGS. 6 and 7 comprises a third control electrode 35, which is arranged on a third connection section 36 of the third outer surface 30 and electrically connected with the at least one excitation electrode E1 of the third control section A3. Thus, the connection sections 16, 26 and 36 can be spaced apart from one another.

The third drive electrode 35 can be electrically connected to the first control electrode 15. For this purpose, this electrical connection can be realized with external lines. As an alternative or in addition, as provided in the embodiment of the actuator 1 according to FIGS. 6 and 7, the first control electrode 15 and the third control electrode 35 can be formed together in one piece or made together as one piece.

The reference electrode 5 is disposed electrically separated from the first, second and third control electrode 15, 25, 35 and electrically connected to the at least one common electrode E2 of the first deformation body D1 and of the second deformation body D2 and of the third deformation body D3. In the embodiment of the actuator 1 according to FIG. 8, the first control electrode 15 and the third control electrode 35 are formed as separate pieces, that is to say are each formed in one piece and are accordingly located at a distance from one another. Otherwise, the embodiment of the actuator 1 according to FIG. 8 is formed as the embodiment of the actuator 1 according to FIGS. 6 and 7.

In particular, the first control electrode 15, the second control electrode 25, the third control electrode 35 and the reference electrode 5, or one or more of these electrodes, may be realized as a layer applied to the respective outer surface or respective outer surfaces or as a flexible plate or be realized as an inflexible plate.

The actuator 1 with the three control sections A1, A2, A3 extends in the longitudinal direction L between the end faces 11, 32, which form the actuator end faces FE1 and FE1, respectively.

According to one embodiment of the actuator 1, the first deformation body D1, the second deformation body D2 and the third deformation body D3 or one or more of these deformation bodies are each made of a homogeneous and electrically deformable material, i.e. formed as a bulk and formed without comprising a multilayer structure. A control section with such a deformation body formed as a bulk comprises at least two actuation electrodes E1, E2, which are formed in particular respectively on one of two end faces of the respective deformation body which are located opposite one another in the longitudinal direction L. One or both of the electrodes can also be arranged within the bulk and at a distance from one another in the longitudinal direction L.

An example of an embodiment in which three deformation bodies D1, D2 and D3 of the actuator 1 are each realized as a bulk is shown in FIG. 9. Each of the control sections A1, A2, A3 comprises two actuation electrodes E1, E2, a first of which is arranged on the first end face and a second of which is arranged on the second end face of the respective deformation body D1, D2, D3, in order to deform the respective deformation body in a predetermined manner when a corresponding voltage signal is applied to the associated actuation electrodes E1, E2 by means of a signal generating device V.

As an alternative or in addition to this, in the actuator 1 according to the invention, one of its control section or several of its control sections can be formed from several control subsections, each of which extend transversely to the longitudinal direction L and are located in layers on top of one another in the longitudinal direction L. Each control section is formed of a plate-shaped actuation electrode which extends transversely to the longitudinal direction with the function of an excitation electrode, of a plate-shaped actuation electrode which extends transversely to the longitudinal direction with the function of a common electrode and of a piezoelectric layer which is located in the longitudinal direction between these actuation electrodes, wherein the piezoelectric layer is electromechanically deformable. FIG. 10 shows, as an example, an embodiment, which comprises three control sections A1, A2, A3, wherein each of the control sections is formed from several control subsections:

the first control section A1 comprises the control subsections A11, A12, A13 with the piezoelectric layers P11, P12, P13, the second control section A2 comprises the control sections A21, A22, A23, A24 with the piezoelectric layers P21, P22, P23, P24, and the third control section A3 comprises the control sections A31, A32, A33, A34 with the piezoelectric layers P31, P32, P33, P34.

Each piezoelectric layer of a control subsection A1, A2, A3 comprises subsection end faces F1, F2 which are located opposite to one another and which extend transversely to the longitudinal direction L and which are oriented opposite to one another in relation to the longitudinal direction L. An actuation electrode E1, E2 is located on each subsection end face F1, F2. The same may have the shape of a plate or of a layer, or may have another shape, and for example may be formed as a wire section. Between two control sections of a control subsection A1, A2, A3 also a material layer can be located which is not electromechanically deformable.

As an example with the reference numerals of FIG. 10, one or more of the following alternatives (a), (b), (c) of the actuator 1 can generally be realized in case that a signal generating device V is electrically connected to the control sections:
  (a) the first control section A1 is formed of a sequence of several first control subsections A11, A12, A13 each with a plate-shaped excitation electrode which extends transversely to the longitudinal direction, with a plate-shaped common electrode which extends transversely to the longitudinal direction and a piezoelectric layer which is located between each two internal electrodes in the longitudinal direction;
  (b) the second control section A2 is formed of a sequence of several second control subsections A21, A22, A23, A24 each with a plate-shaped excitation electrode which extends transversely to the longitudinal direction, with a plate-shaped common electrode which extends transversely to the longitudinal direction and a piezoelectric layer which is located between each two internal electrodes in the longitudinal direction;
  (c) the third control section A3 is formed of a sequence of several third control subsections A31, A32, A33 each with a plate-shaped excitation electrode which extends transversely to the longitudinal direction, with a plate-shaped common electrode which extends transversely to the longitudinal direction and a piezoelectric layer which is located between each two internal electrodes in the longitudinal direction.

In this case, the control section or the control sections which are not formed according to (a), (b) or (c) may be formed in bulk construction.

The actuator 1 according to the invention can also be realized by combinations of alternatives (a), (b), (c) with features or embodiments which are described with reference to FIG. 10.

The actuator 1 may be coated in sections or completely on its outside. In the actuator 1 which is realized according to the invention, for example with at least two control sections A1 and A2, by a corresponding control with voltage signals, which are generated by the signal generating device V and which are acting respectively between the actuation electrodes E1, E2 lying adjacent in the longitudinal direction L, the deformation states shown in FIGS. 4 and 5 can be caused in an alternating sequence.

The actuation electrodes E1, E2 can be realized in various manners in the embodiments of the actuator 1 mentioned herein and also in control sections thereof. For example, the actuation electrodes E1, E2 can be shaped as a plate, layered, shaped as a line section or shaped as material patches.

According to the invention, the actuator 1 may be held in a holding device 40 and preferably may be structurally integrated therein, so that the actuator 1 together with the holding device 40 forms a drive device K. The holding device 40 may be realized as a tensioning frame 41 which, at least in sections, is made of an elastic material is formed, in which the control sections of the respective actuator 1 are resiliently clamped. The clamping force or the compression force which the holding device 40 exerts on the actuator 1 acts in the longitudinal direction L of the actuator 1 in order to preload the actuator 1 in this direction. In this way, the actuator is under compressive stress and is thus returned more quickly from an expanded state to a contracted state. The holding device 40 is preferably realized such that it extends at least on one side of the actuator 1 over a distance running from the first actuator end face FE of the actuator 1 to the second actuator end face FE2 of the same and thus that the same surrounds or embraces or clasps the actuator 1 at least in sections in the longitudinal direction L.

According to the invention, a method for operating an actuator 1 and preferably an actuator according to the above description with at least two control sections A1, A2, which are arranged one behind the other in a longitudinal direction L of the actuator 1, is provided. Furthermore, according to the invention, a method for operating a drive device K, which comprises an actuator 1 according to the invention and a friction element F which is arranged on an actuation surface 1 $a$, is provided. The friction element F can be disposed directly or indirectly, for example via an intermediate layer or structural component lying in between, on the first end face 11 of the actuator 1, so that deformation movements of the actuator 1 cause corresponding changes in position and orientation of the friction element F. The deformation movements of the actuator 1 cause changes in position of the actuation area 1 $a$ at the position of the friction element F, which for example are shown in FIGS. 12, 14 and 16 as a function of time. In the embodiments of the drive device K of FIGS. 17 to 26 the outer actuation area 1 $a$ is located on an end face 11, 12 of the same which is formed in the longitudinal direction L of the actuator 1. This end face can be the end face 11 of the first control section A1 of the actuator 1, so that in FIGS. 17 to 26 this end face is the actuation area which is labeled by the reference symbol "1 $a$". In FIGS. 27 to 45, the actuation surface is an outer surface of a structural component which is arranged on the end face 11, wherein the structural component is realized as a holding device. Alternatively or additionally, the friction element F can also be arranged on a second end face or third end face, which is oriented opposite to the first end face 11, or on an outer surface of a layer or structural component arranged thereon.

In particular, the actuator according to one of the embodiments described herein is formed with at least a first control section which is deformable by an electrical voltage with a first end face 11 and a second control section which is deformable by an electrical voltage with a further end face, which is oriented opposite to the first end face 11. According to the invention, a friction element F for formation of the drive device K may be located on the first end face 11 or the further end face.

In this case a first control section A1, which is deformable by an electrical voltage, is controlled with a first voltage signal S10 and, superimposed in time segments, a second control section A2, which is deformable by an electrical voltage, is controlled with a second voltage signal S20.

The first voltage signal S10 comprises a signal which is formed of: a plurality of signal sections or signal flanks S11 which increase according to absolute amount, a plurality of signal sections or signal flanks S12 which decrease according to absolute amount and a plurality of intermediate signal sections S13, each of which is positioned between one signal flank S11, which increases according to absolute amount, and one signal flank S12, which decreases according to absolute amount. The signal intermediate sections S13 extend over a time interval tz which differs from zero, or, to put it another way: the time interval tz extends over a time period which comprises the amount of which is not equal to zero.

The first voltage signal S10 comprises signal flanks which are increasing according to absolute amount and signal flanks which are decreasing according to absolute amount. The expression "increasing according to absolute amount" in this context means that the signal in question increases at least in sections in the direction of a time axis T, i.e. that the voltage signal S10 comprises first signal sections SA1 with a signal flank S11 with positive gradient. The expression "decreasing according to absolute amount" means in this context that the signal in question decreases at least in sections in the direction of a time axis T, i.e. that the voltage signal S10 comprises second signal sections SA2 with a signal flank S12 with a negative gradient. The first signal sections SA1 and the second signal sections SA2 may generally be signal sections which are continuous in the course of time, that is to say uninterrupted in time, or signal sections that are discontinuous in time, that is to say interrupted in the course of time.

The first signal sections SA1 do not necessarily consist of increasing signal flanks S11, i.e. they do not have to be formed exclusively from a signal flank S11 that increases according to absolute amount. The first signal sections SA1 may also comprise subsections without a gradient or subsections with a negative gradient. Likewise, the second signal sections SA2 may not necessarily consist of decreasing signal flanks S12, i.e. the same do not have to be formed exclusively from a decreasing signal flank S12 according to absolute amount. The second signal sections SA2 may also have subsections without a gradient or subsections with a negative gradient.

The first signal sections SA1 of an embodiment of the first voltage signal Si according to the invention may, however, in particular be defined in such a way that they are formed of or exclusively consist of increasing signal flanks S11 according to the definition according to the invention. Alternatively or additionally, the second signal sections SA2 of an embodiment of the first voltage signal Si according to the invention can be defined in such a way that they are formed of or exclusively consist of decreasing signal flanks S12 according to the definition according to the invention.

An intermediate section S13 defined according to the invention forms a local maximum and differs both from the signal flank S11, which is increasing according to absolute amount, and the signal flank S12, which is decreasing according to absolute amount, in that the signal shape of the intermediate section S13 according to the invention differs over time both from the signal shape of the signal flank S11 which is increasing according to absolute amount and from the signal shape of the signal flank S12 which is decreasing according to absolute amount.

In addition, the signal intermediate section S13 can be defined in that the same comprises a time-dependent gradient which comprises a value of a maximum of 10 degrees. Additionally or independently of this, it can be defined that the gradient of the signal flank S11, which increases according to absolute amount, lies, in the course of time, immediately before the signal intermediate section S13, has a value of more than 10 degrees and preferably a value of more than 20 degrees. It can also be defined additionally or independently of this that the absolute value of the gradient of the decreasing signal flank S12, which is immediately after the signal intermediate section S13, comprises a value of more than 10 degrees and preferably a value of more than 20 degrees. In the case of these variants, it can be defined in particular that the temporal length of the signal flank S11 which increases according to absolute amount is larger than the temporal length of the signal intermediate section S13.

In these variants, it can also be defined in particular that the temporal length of the signal flank S12 which is decreasing according to absolute amount is larger than the length of the signal intermediate section S13.

An embodiment of the first voltage signal S10, which is used in the method according to the invention, comprises a plurality of signal flanks S11 which are increasing according to absolute amount, each of which is immediately followed in time by an intermediate section S13, wherein this intermediate section S13 is followed directly in time by a signal flank S12 that decreases according to absolute amount. An example of this embodiment is shown in FIG. 11. According to the invention, it is essential that the first voltage signal S10 comprises several signal section groups G1 each consisting of the sequence of an increasing signal flank S11, a temporally directly following intermediate section S13 and a temporally directly following decreasing signal flank S12. According to the invention, in case that such a signal section group G1 consisting of the sequence of an increasing signal flank S11, of a temporally directly following intermediate section S13 and a temporally directly following decreasing signal flank S12 and a, after this signal section, temporally next increasing signal flank occurs, not necessarily the occurrence of a group of the same manner not necessarily follows. In the case of a first voltage signal S10, after a signal flank S11 which increases according to absolute amount also other signal flanks may follow which do not comprise an intermediate section S13 as defined according to the invention. Further, with a first voltage signal S10 temporally directly after a signal flank S11 which is increasing according to absolute amount, a decreasing signal flank may follow. According to an embodiment of the method according to the invention, the first voltage signal S10, however, may also comprise a plurality of signal section groups G1 which temporally follow one another.

An embodiment of the first voltage signal S10 used in the method according to the invention may be formed of a temporal sequence of signal section groups G1 each consisting of an increasing signal flank S11, of a temporally directly following intermediate section S13 and a temporally directly following decreasing signal flank S12, wherein each signal section group G1 may in particular have a sawtooth shape or a trapezoidal shape or essentially one of these shapes, this means that each of the signal flank S11, the intermediate section S13 and the signal flank S12 are formed straight-line.

In the embodiments of the method according to the invention, the second voltage signal S20 comprises at least one relatively high-frequency signal section S21. In this case, the second voltage signal S20 may comprise have at least one connection signal section S22, which connects respective two relatively high-frequency signal sections S21. As shown in FIGS. 11 and 15, the connection signal section S22 may have a value which is constant over time and in particular which has the value zero. The connection signal section S22 may alternatively consist of a relatively low-frequency signal or be formed from this.

An example of an embodiment of the method in which a control of an actuator 1, which comprises three control sections A1, A2, A3, with a first voltage signal S10 with trapezoidal shape and the second voltage signal S20 is shown in FIG. 11. The relatively high-frequency signal section S21 of the second voltage signal S20 begins in the intermediate sections S13 and extends over the respectively adjoining decreasing signal flank S12 and also over a part of the intermediate section S13 which respectively adjoins the same. The position changes U of a reference position on the first end face 11 or the actuation area 1 *a* over time, which result from this control, is shown in FIG. 12.

In the embodiment of FIG. 11, the first voltage signal S10 is additionally formed of a directly consecutive sequence of the signal section groups G1 or, in a special case, with a different selection of the starting point of the first voltage signal S10, of a directly consecutive sequence of the signal section groups G2.

In the case of the first voltage signal S10 shown in FIG. 11 or the signal section groups G1 of the same, the increasing signal flank S11 comprises a smaller gradient according to absolute amount than the decreasing signal flank S12. From this, over time within a signal section groups G1, a temporally slower change of the state of the shape or of the deformation of the actuator 1 results during the increasing signal flank S11 than during the decreasing signal flank S12. In this case, the amount of the gradient of the increasing signal flank S11 is set in such a way that, due to the speed of the change in the state of shape of the actuator 1 caused by this, a static friction between the friction element F arranged on the actuation surface 1 *a* and the friction surface 90 *a* of the element 90 to be driven, against which the friction element F rests, results. In this period of time, with the change of the states of the shape of the actuator 1, the position of the contact surface FK (FIG. 19) of the friction element F, which rests against the friction surface 90 *a* of the element 90 to be driven, changes, and thus the position of the element 90 to be driven in a first drive direction, because the same is taken along by the contact surface of the friction element F due to the existing static friction. In this way, propulsion of the element 90 to be driven is achieved in the first drive direction.

Furthermore, the amount of the gradient of the decreasing signal flank S12 is set in such a way that, due to the comparatively higher speed of the change of the state of the shape of the actuator 1 which is caused by the same, no static friction between the friction element F and the friction surface 90 *a* occurs, but sliding friction results. In the time section of the decreasing signal flank S12, the inertia of the element 90 to be driven relative to the friction force which occurs between the contact surface FK of the friction element F, which is in contact with the friction surface 90 *a* of the element 90 to be driven, and the friction surface 90 *a* is so large that with the comparatively rapid change of the state of the shape of the actuator 1 and the position of the contact surface FK of the friction element F a relative movement and thus a slide friction between the contact surface and the FK friction surface 90 *a* of the element 90 to be driven results. In this period of time, the element 90 to be driven is not advanced, but a return movement of the contact surface FK of the friction element F relative to the friction surface 90 *a* of the element 90 to be driven occurs. After the temporal end of the signal flank S12 is reached, an increasing signal flank S11 of a further signal section group G1 can in turn be adjoined in order to achieve a further advance of the element 90 to be driven.

In general, in the case of a voltage signal S10 to achieve a first drive direction, a signal section group G1 is realized in such a way (a) that the first signal section SA1 comprises at least one section which comprises a gradient with which a movement speed of the friction element F results with which a static friction state between the friction element F, which is disposed on the actuation surface 1 *a*, and the friction surface 90 *a* of the element 90 to be driven, on which the friction element F rests, occurs, (b) that the second signal section SA2 comprises a gradient according to absolute amount at every position, with which a movement speed of the friction element F results, at which a slide friction state between the friction element F, which is disposed on the actuation surface 1 *a*, and the friction surface 90 *a* of the element 90 to be driven, on which the friction element F rests, occurs.

The friction element F assumes a neutral state with regard to its shape or its orientation or both aspects in case the actuator 1 is in a neutral state. Both in the first signal section SA1 and in the second signal section SA2 the friction element F in its orientation or in its state of shape is in a state of motion contrary to the neutral state. In the embodiments of the method according to the invention, the intermediate section S13, which is located between the first signal section SA1 and the second signal section SA2, is a signal section in which no change in the state of the shape of the actuator 1 occurs or in which a change in the state of the shape of the actuator 1 occurs which is significantly smaller in comparison with the first and second signal sections SA1, SA2. While a signal strength of an intermediate section S13 is applied, a restitution of the friction element F and optionally of the friction element F together with a holding device, in which the actuator 1 is received, from a respective momentary state of motion into the neutral state may take place, before the friction element F is again brought into a state of motion as soon as the actuator 1 is controlled with the first signal section SA1 or the second signal section SA2.

A special embodiment of the first voltage signal S10 used in the method according to the invention for generating the first drive direction of the element 90 to be driven comprises, due to a corresponding starting point for the first voltage signal S10, a plurality of signal section groups G2 each consisting of the sequence of a signal flank S12 which decreases according to absolute amount, of a temporally directly subsequent intermediate section S13 and a temporally directly adjoining signal flank S11 which increases according to absolute amount, wherein the increasing signal flank S11 comprises a gradient which is smaller according to absolute amount than the decreasing signal flank S12. In this embodiment of the first voltage signal S10, when such a signal section group G2 and a decreasing signal flank, which is next in time after this signal section group, occurs, the occurrence of such a group does not necessarily follow. Accordingly, in the case of the first voltage signal S10, after a decreasing signal flank S12, other signal sections may also follow temporally which do not have an intermediate section S13 defined according to the invention. Further, in the case of a first voltage signal Si, a decreasing signal flank S12 according to absolute amount can also be temporally directly followed by an increasing signal flank S11. According to an embodiment of the method according to the invention, however, the first voltage signal S10 can also have a plurality of such groups which temporally follow one another. The signal section group G2 can in particular have a sawtooth shape or a trapezoid shape.

FIGS. 13 and 14 illustrate by way of example for the embodiments of the method according to the invention that the second voltage signal S20 is switched on in such a way that the relatively high-frequency signal segment S21 already occurs in the temporal intermediate section S13 of the voltage signal S10 applied to the actuator 1 and is applied over a time section TV within the same. Further, the signal section S21 of the voltage signal S20 takes place still in the following intermediate section and only a time period TN in the same. In FIG. 15 a further embodiment of the method according to the invention with a control of an actuator 1, which comprises three control sections A1, A2, A3, with the first voltage signal S10 and the second voltage signal S20 is shown. The increasing signal flank S11 of the first voltage signal S10 or the signal section groups G1 of the same shown in FIG. 15 comprises a larger gradient according to absolute amount than the decreasing signal flank S12. Thereby, in the temporal course of time within a signal section group G1, during the increasing signal flank S11, the shape state or the deformation of actuator 1 changes more quickly than during the decreasing signal flank S12. In this case, the amount of the gradient of the increasing signal flank S11 is set in such a way that, due to the speed of the change in the shape state of the actuator 1 caused by this, no static friction between the friction element F which is disposed on the actuation surface 1 *a* and the friction surface 90 *a* of the element 90 to be driven, with which the friction element F is in contact, occurs, but a sliding friction state results. In the time segment of the increasing signal flank S11, the inertia of the element 90 to be driven relative to the friction force which occurs between the contact surface FK of the friction element F, which is in contact with the friction surface 90 *a* of the element 90 to be driven, and the friction surface 90 *a* is so large that, with the comparatively rapid change in the shape state of the actuator 1 and the position of the contact surface FK of the friction element F, a relative movement between the contact surface FK and the friction surface 90 *a* of the element 90 to be driven results. Therefore, in this time segment no advance of the element 90 to be driven occurs, but a relative movement between the contact surface FK of the friction element F and the friction surface 90 *a* of the element 90 to be driven results, with the relative movement being directed opposite to drive direction and being without effect for the advance.

In general, for achieving the second drive direction a signal section group G1 of a voltage signal S10 is realized in such a way (a) that the first signal section SA1 has, at least in sections and in particular at each position, a gradient with which a speed of motion of the friction element F results, in which a slide friction state between the friction element F, which is disposed on the actuating surface 1 *a*, and the friction surface 90 *a* of the element 90 to be driven, on which the friction element F rests, occurs, (b) that the second signal section SA2 comprises at least one section which comprises a gradient with which a motion speed of the friction element F results with which a static friction state between the friction element F, which is disposed on the actuation surface 1 *a* and the friction surface 90 *a* of the element to be driven 90, on which the friction element F rests, occurs.

A special variant of the first voltage signal S10 which is used in this regard for generating the second drive direction of the element 90 to be driven comprises, with a corresponding starting point of the first voltage signal S10, a plurality of signal section groups G2 each consisting of the sequence of a decreasing signal flank S12 according to absolute amount, a temporally directly following intermediate section S13 and an increasing signal flank S11 according to absolute amount which temporally directly follows, wherein the increasing signal flank S11 according to absolute amount comprises a larger gradient than the decreasing signal flank S12.

Furthermore, the amount of the gradient of the decreasing signal flank S12 is set such that, due to the slower speed of the change in the shape state of the actuator 1 caused by this, static friction between the friction element F and the friction surface 90 *a* predominates. In this time section, with the change of the shape state of the actuator 1, the position of the contact surface FK (FIG. 19) of the friction element F, which rests on the friction surface 90 *a* of the element 90 to be driven, and thus the position of the element 90 to be driven in a second and drive direction opposite to the first drive direction changes, since the same is taken along by the contact surface of the friction element F due to the existing static friction. In this way, while the decreasing signal flank S12 is applied, the element 90 to be driven is advanced in the second drive direction, which is directed opposite to the first drive direction, which is caused due to signals generated in FIGS. 11 and 12.

After reaching the temporal end of the signal flank S12, an increasing signal flank S11 of a further signal section group G1 may in turn be adjoined in order to achieve a further advance of the element 90 to be driven. In the embodiment of FIG. 13, the first voltage signal S10 is additionally formed from a directly following sequence of the signal section group G1.

The high-frequency signal section S21 of the second voltage signal S20 begins in the embodiments of the method according to the invention within the time interval tz in the intermediate sections S13 and extends along the subsequent decreasing signal flank S12 and also along a part of the respective subsequent intermediate section S13. The changes in position U of a reference point on the first end face 11 or of the actuation surface 1 *a*, in particular on which the friction element F is arranged, which results from this control, is shown over time in FIG. 16. By activating the second voltage signal S20 during an intermediate section S13 of the first voltage signal S10, the friction between the friction element F arranged on the actuation surface 1 *a* and the friction surface 90 *a* of the element 90 to be driven, on which the friction element F rests, is reduced. By activating the second voltage signal S20 in an intermediate section S13, which occurs temporally a time before a signal section SA1, SA2 with a signal flank with a gradient amount by which no static friction and thus slide friction between the friction element F and the friction surface 90 *a* occurs, already before the application of this respective signal section SA1, SA2 a reduction in the friction between the friction element F and the friction surface 90 *a* is caused. Since the friction is already reduced in this way at the temporal begin of this respective signal segment SA1, SA2, it is ensured in an optimized manner that the friction element F does not carry along the friction surface 90 *a* during a change from the static to the slide friction phase. As a result, the accuracy of the movement of the element 90 to be driven generated by the friction element F is optimized.

In all embodiments of the method according to the invention, it can be provided that the signal flanks S11 of the first voltage signal S10, which increase according to absolute amount, run linearly and thus have a positive and temporally constant gradient. In this case, several groups G1 and G2 and in particular a direct succession of groups G1, of groups G2 or alternately of groups G1 and G2 may have increasing signal flanks S11 that run linearly and thus have a positive and temporally constant gradient. The increasing signal flanks S11 may each have the same gradient.

As an alternative or in addition to this, the embodiments of the first voltage signal S10 which is used in the method according to the invention may comprise signal flanks S12 which decrease according to absolute amount and run linearly and thus have a gradient which is negative and is constant over time. Several groups G1 and G2 and in particular a direct succession of groups G1, of groups G2 or alternately of groups G1 and G2 may comprise decreasing signal flanks S12, which run linearly and thus have a negative and temporally constant gradient. In this case, the decreasing signal flanks S12 can each have the same gradient.

An embodiment of the first voltage signal S10 which is used in the method according to the invention may comprise intermediate sections S13 which run linearly. In this case, a plurality of groups G1 and G2 and in particular a direct succession of groups G1, of groups G2 or of alternately groups G1 and G2 may comprise intermediate sections S13 which run linearly. In each case. It can be provided that the intermediate section S13 is a section with a gradient has the value zero in sections or, as shown in the examples in FIGS. 11 and 13, throughout.

The control of the second control section A2 with the second voltage signal S20 temporally begins according to the invention within the time interval tz of the signal intermediate section S13 of the first voltage signal S10, which is located in particular by a time section TZ before a signal flank which causes a relative movement between the friction element F which is arranged on the actuation surface 1 *a* and the friction surface 90 *a* of the element 90 to be driven.

In particular, if a frequency of the first voltage signal S10 is defined from the temporal sequence of two signal intermediate sections S13, in each case after an increasing signal flank S11 or in each case after a decreasing signal flank S12, the frequency of the second voltage signal S20 may be, at least in these signal intermediate sections S13, a factor of at least 10 times higher compared to the frequency of the first voltage signal S10 defined in this way.

In general, the high-frequency signal section S21 of the second voltage signal S20 may be sinusoidal.

According to an embodiment of the method according to the invention, in particular in combination with one of the features of the same described above, the second voltage signal S20 begins at a point in time which occurs after at least 10% and at most 90% of the time interval tz of the signal intermediate section S13 has passed. Alternatively or additionally, the begin of the second voltage signal S20 occurs at a point in time which lies 50% of the time interval of the signal intermediate section S13 before the end of the same.

According to an embodiment of the method according to the invention, in particular in combination with one of the previously described features of the same, the second voltage signal S20 extends over a temporally directly following or temporally adjacent signal section SA1 with a increasing signal flank S11 uninterruptedly up to a temporally following signal intermediate section 13 and ends in particular with the expiration of a time section TN within the time interval tz this signal intermediate section 13 or with its end. Further, according to one embodiment of the method according to the invention, in particular in connection with one of the previously described features of the same, the second voltage signal S20 may continue uninterruptedly over a temporally directly following or temporally adjacent signal section SA2 with a decreasing signal flank S12 up to a temporally following intermediate signal section 13 and may end within the time interval tz of this signal intermediate section 13 or with its end.

According to an embodiment of the method according to the invention, in particular in combination with one of the features of the same described above, the maximum amplitude of the second voltage signal S20 amounts at most to 50% of the maximum amplitude of the first voltage signal S10.

According to a further embodiment of the method according to the invention, in particular in combination with one of the previously described features thereof, the following takes place:
(a) during the activation of the first control section A1, simultaneous activation of a plurality of first control subsections, which form the first control section A1 and which are located one behind the other in the longitudinal direction L, with the first voltage signal S10,
(b) during the activation of the second control section A2, simultaneous driving of a plurality of second control sub-sections, which form the second control section A2 and are located one behind the other in the longitudinal direction L, with the second voltage signal S20.

According to a further embodiment of the method according to the invention, in particular in combination with one of the above-described features of the same, a control of a third control section A3, which is deformable by an electrical voltage, with the first voltage signal S10 takes place simultaneously with the control of the first control section A1 with the first voltage signal, wherein the third control section is arranged in such a way that the second control section A2 is located between the first and the third control section A3.

In FIGS. 17 to 19, an embodiment of the drive device K is shown, which is referred to below with the reference symbol "K1". The embodiment of the holding device 40 of FIG. 17 comprises a receiving part 43 for receiving the second actuator end face FE2 of the actuator 1, a holding part 44 for holding the friction element F or the first end face 11 and two connecting parts 45, 46, which run along each other and connect the receiving part 43 and the holding part 44. Due to the position of the actuator 1 in the holding device 40, a central axis Z of the drive device K1 may be defined, which may run along or in particular in the direction of the longitudinal direction L of the actuator 1. The central axis Z may be an axis of symmetry of the mounting device 40 or a middle axis thereof. In the embodiments of the drive device K described with reference to FIGS. 17 to 26, the friction element F is located on the first actuator end face FE1, which is thus the outer actuation surface 1 *a*. The actuation surface 1 *a* can also be the outer surface of an intermediate layer or structural component located on the first actuator end face FE1. In the embodiments of FIGS. 17 to 26, the receiving part 43, the holding part 44 and the two connecting parts 45, 46 delimit a receiving space 49 which hold the actuator 1 together with the friction element F or the respective control sections of the actuator 1 with the friction element F. The actuator 1 extends with the friction element F in the longitudinal direction L between the receiving part 43 and the holding part 44. The friction element F is thus arranged within the holding device 40 or within the receiving space 47. In the embodiments of FIGS. 17 to 26, the friction element F extends in its longitudinal direction LF from an area between the first actuator end face FE1 and the holding part 44 with its longitudinal direction LF transverse to the longitudinal direction L of the actuator 1 to a friction surface 90 *a* of the element 90 to be driven, wherein the friction surface 90 *a* generally faces the friction element F.

As seen from the drive device K1, the holding part 44 presses on the friction element F from the outside in a direction which runs along the longitudinal direction L to the actuation surface 1 *a*. Due to the movements of the actuation surface 1 *a*, which are caused by the deformation states of the actuator 1 by corresponding application of voltage as shown in FIGS. 4 and 5, corresponding movements of the friction element F result, by which the element 90 to be driven can be moved.

The actuator 1 according to the invention with the holding device 40 may be built in or integrated into a support device 50 of a motor M, wherein the support device is disposed spatially fixed, i.e. arranged stationary in a spatial reference system. In case of a dynamic deformation of the actuator 1 and the resulting movement of the actuation surface 1 a, the friction element F moves relative to the support device 50 or the spatial reference system and causes a movement of the element 90 to be driven, which is in frictional contact with the friction element F and is guided by a guide device 95 in a guide path predetermined by the latter. The guide device 95 is in particular arranged in a stationary manner relative to the support device 50 as a reference system.

In the embodiment according to FIG. 17, the support device 50 comprises a base plate 51, which may in particular has the function of a support plate or connection plate.

The support device 50 may comprise a pretensioning device 60 which exerts a force on the drive device K or on the friction element F, which is directed from the base plate 51 to the friction element F and presses the same against the element 90 to be driven. In the embodiment of the drive device K of FIG. 17, the pretensioning device 60 is realized as a plate 64 or spring plate, which is attached with a first end portion 65 on the base plate 61. The plate 64 is located on the base plate 51 of the support device 50 such that a second end portion 66, which is located opposite to the first end portion 65, rests against the friction element F and presses the friction element F against the element 90 to be driven with a compression force in case that the drive device K is built into a motor M. As shown in FIG. 17, the actuator 1 can be located at least partially in a recess 57 of the base plate 51, which may be an indentation or a through opening open towards the element 90 to be driven, wherein the plate 64, starting from an edge portion of the recess 57, protrudes into recess 57 in which the second end section 66 rests against the friction element F. Alternatively or additionally, the pretensioning device 60 can be realized as a compression spring, which is located between the base plate 51 and the friction element F or, if necessary, between the plate 64 and the friction element F.

A motor M with a drive device K and the support device 50 is shown schematically in FIGS. 17 to 22, in each of which the actuator 1 is shown schematically. The support device 50 can also be realized in a different manner and for example as a mounting device. An embodiment of the actuator 1 described herein can be built in or integrated in the motor M according to the invention. The motor M comprises the drive device K, the element 90 to be driven and a guide device 95, which is structurally and statically connected to the base plate 51, so that the element 90 to be driven can be moved relative to the base plate 51 due to the deformations of the actuator 1 and the movement of the friction element F.

FIGS. 17 to 22 show an embodiment of the motor M in which an actuator 1 is structurally integrated with three control sections A1, A2, A3 arranged one behind the other in the longitudinal direction L. The drive device K used therein with such an actuator 1 is shown as a detail in FIGS. 17 to 26. In the embodiments described with reference to FIGS. 17 to 26, the friction element F is located on the first end face 11 of the first control section A1 as the first actuator end face FE1, which is thus the outer actuation area 1 a is.

In a further embodiment, the friction element F can be located on an outer surface 44 a of the holding part 44 of the holding device 40 as actuation surface 1 a, which is oriented opposite to an inner surface 44b of the holding part 44 on which the actuator 1 rests. In this regard, it can be provided in particular that the friction element F is fastened to the holding part 44. It can be provided that the friction element F extends with its longitudinal direction LF transversely to the longitudinal direction L or along the longitudinal direction L of the actuator 1 to a friction surface 90 a of the element 90 to be driven.

An embodiment of the drive device K with these features is shown in FIGS. 27 to 30. The same is referred to below with the reference symbol "K2". The actuator 1 can be implemented according to one of the embodiments described herein.

The embodiment of the drive device K2 shown in FIGS. 27 to 30 comprises a holding device 240 which comprises: a receiving part 243 which extends at least in sections transversely to the longitudinal direction L for receiving the second actuator end face FE2 as a bearing surface 1b of the actuator 1, a holding part 244 which extends at least in sections transversely to the longitudinal direction L for holding the friction element F and for receiving the first actuator end face FE1, and two connecting parts 245, 246, which run along the longitudinal direction L and connect the receiving part 243 and the holding part 244. The receiving part 243, the holding part 244 and the connecting parts 245, 246 form a receiving space 249 in which the actuator 1 is located. The friction element F is located on an outer surface 244 a of the holding part 244 of the holding device 240 as actuation surface 1 a, which is oriented opposite to an inner surface 244b of the holding part 244 on which the actuator 1 rests. The friction element F extends in a reference or neutral position with its longitudinal direction LF in the longitudinal direction L or along the longitudinal direction L of the actuator 1 towards the friction surface 90 a of the element 90 to be driven when the drive device K2 is built into a motor.

It is also conceivable that the longitudinal direction LF of the friction element F extends transversely to the longitudinal direction L of the actuator 1 towards a friction surface 90 a of the element 90 to be driven. The friction element F may also be arranged between the holding part 244 and in particular the inner surface 244b of the holding part 244 and the actuator 1.

Due to the position of the actuator 1, a central axis Z of the drive device K2 can be defined, which can run along or in particular in the direction of the longitudinal direction L of the actuator 1. The central axis Z can be an axis of symmetry of the mounting device 240 or a central axis of the same. The connecting parts 245, 246 extend along the central axis Z. The connecting parts 245, 246 each have an outer surface 245 c and 246 c, which run along the longitudinal direction L of the actuator 1 or the central axis Z and are oriented opposite to one another. The receiving part 243, the holding part 244 and the connecting parts 245, 246 can be manufactured as one piece. Alternatively, as shown in FIGS. 27 to 30, the holding part 244 can be used as a first part of its own and the receiving part 243 and the connecting parts 245, 246 can be realized as a second part of their own. The holding device 240 can also be realized in such a way that it comprises only one single connecting part 245 or 246. The receiving part 243 and the at least one connecting part 245 or 246 can be realized as parts of their own. The holding part 244 can in particular be formed in the shape of a plate or in the shape of a web. The receiving part 243 and the at least one connecting part 245 or 246 can overall form a horseshoe shape.

The mounting device 240 can be realized as a tensioning frame 241 into which the control sections of the respective actuator 1 are clamped between the receiving part 243 and the holding part 244 and thereby exert a clamping force in the form of a compression force on the actuator 1, which acts in the longitudinal direction L of the actuator 1. In this embodiment of the mounting device 240, by the clamping force the actuator 1 is resiliently biased in a predetermined contracted state with regard to the longitudinal direction L, for example in a reference state or a neutral state. An elastic pretension of the actuator 1 is given in particular by the fact that the holding part 244 is plate-shaped or web-shaped. In particular, the holding part 244 can be formed at least in sections from an elastic material. Due to this pretension, the actuator 1 is returned more quickly from an expanded state to a contracted state. The holding device 240 is realized in such a way that the same extends at least on one side of the actuator 1 over a distance which runs from the actuating surface 1 *a* to the support surface 1*b* and thus surrounds or clasps the actuator 1 in the longitudinal direction L.

The first end section 245 *a* of a first connecting part 245 and the second end portion 246 *a* of a second connecting part 246 is located on the holding part 244 or the actuation surface 1 *a* of the actuator 1. In the embodiments of holding device 240 it may be provided that each of two opposite end sections 247 or 248 of the holding part 244 is attached to the respective end section or end section 245 *a*, 246*a* of the at least one connecting part 245 or 246, in each case for example by means of a connecting element 245 *d* or 246 *d*. It can be provided that the position of the holding part 244 relative to the receiving part 243 or to the connecting parts 245 or 246 and in particular to the end sections 245 *a* or 246*a* can be adjusted by means of an adjusting device. The adjustment device may be realized by the connecting elements 245 *d* or 246 *d* can be implemented, with which the distance between a respective outer end section 245*a* or 246*a* can be adjusted. By adjusting the position of the holding part 244 relative to the at least one connecting part 245 or 246, the clamping force acting on the actuator 1 may be adjusted.

The friction element F can be located centrally on the central axis Z. Alternatively or additionally, the actuator 1 can also be located centrally on the central axis Z, wherein the longitudinal direction L can coincide with the central axis Z. In general, the longitudinal direction L may be located in at a distance from the central axis Z, which is different from the value zero. In the embodiment of the drive device K2 shown in FIG. 27, the actuator 1 is located as a whole on one side of the central axis Z and the friction element F is located centrally on the central axis Z. In the embodiments of the drive device K2 shown in FIGS. 27 to 30, the outer surfaces 245 *c* and 246 *c* are arranged symmetrically to the longitudinal direction L of the actuator 1.

In the embodiment of the drive device K2, the actuator 1 can be realized according to one of the embodiments of the same described herein. In FIG. 31, the actuator 1 comprises a first control section A1, a second control section A2 and a third control section A3.

FIGS. 31 to 34 show a variant of the embodiment of the drive device according to FIGS. 27 to 30 which is herein referred to with the reference symbol "K3" and which comprises a holding device 340, which comprises: a receiving part 343 which extends transversely to the longitudinal direction L and which is provided for receiving the second actuator end face FE2 as a support surface 1*b* of the actuator 1, a holding part 344 which extends at least in a section transversely to the longitudinal direction L and which is provided for holding the friction element F and for receiving the first control section A1 of the actuator 1 with the first end face 11 as a first actuator end face FE1 and a first and second connecting part 345, 346, which run along the longitudinal direction L and connect the receiving part 343 and the holding part 344 to one another. The friction element F is located on an outer surface 344 *a* of the holding part 344 of the holding device 340 as actuation surface 1 *a*, which is oriented opposite to an inner surface 344*b* of the holding part 344 on which the actuator 1 rests. The friction element F extends in a reference or neutral position with its longitudinal direction LF in the longitudinal direction L or along the longitudinal direction L of the actuator 1 towards the friction surface 90 *a* of the element 90 to be driven when the drive device K3 is built in a motor. Due to the position of the actuator 1, a central axis Z of the drive device K3 can be defined which can run along and in particular in the direction of the longitudinal direction L of the actuator 1. The central axis Z can be an axis of symmetry of the holding device 340 or a central axis thereof. The following essentially describes features in which the drive device K3 differs from the drive device K2. The first end section 345 *a* of the connection part 345 and the second end portion 346 *a* of the second connection part 346 are located on the first holding part 344 or the actuation surface 1 *a* of the actuator 1. The receiving part 343, the holding part 344 and the connecting parts 345, 346 form a receiving space 349 in which the actuator 1 is located. The outer surfaces 345*c*, 346*c* of the connecting parts 345, 346, which are oriented opposite to one another, run along the longitudinal direction L of the actuator 1 or the central axis Z.

In the drive device K3, a first end section 347 of the holding part 344 is located above the first end section 345 *a* of the first connecting part 345 and the holding part 344 extends transversely to the longitudinal direction L from the first end section 345 *a* of the first connecting part 345 to the second end portion 346 *a* of the second connecting part 346. Here, the first end section 347 of the holding part 344 is located, when viewed transversely to the longitudinal direction L, over the first end portion 345 *a* of the first connecting part 345 and the second end portion 348 of the holding part 344 is formed with the second end portion 346 *a* of the second connecting part 346 as one piece. The first end section 347 of the holding part 344 may be formed as one piece with the first end section 345 *a* of the first connecting part 345 or, as shown in FIG. 22, may be connected to the latter via a connecting element 345 *d*. In particular, the position of the holding part 344 and the position of the receiving part 343 can be provided in such a way that the same clamp the actuator 1 in its longitudinal direction L and exert a clamping force on the actuator 1 in the form of a compression force that acts in the longitudinal direction L of the actuator 1. The first end section 347 of the holding part 344 can be connected to the first end section 345 *a* of the first connecting part 345 by means of an adjusting device. The same may be realized by a connecting element with which the distance between the first end section 347 of the holding part 344 and the first end section 345 *a* of the first connecting part 345 can be adjusted in order to adjust a clamping force or pressure force which acts in the longitudinal direction L to the actuator 1.

The friction element F is disposed on an elevation 344*e* of the outside 344 *a* of the holding part 344. In the embodiment of the drive device K3, which is shown in FIGS. 22 to 23, the friction element F is located centrally on the central axis Z. The longitudinal direction LF of the friction element F extends in the longitudinal direction L or along the longitudinal direction L of the actuator 1 towards the friction surface 90 *a* of the element 90 to be driven, in case that the drive device K3 is installed in a motor M. Alternatively, it can be provided that the friction element F extends with its longitudinal direction LF transversely to the longitudinal direction L of the actuator 1 towards a friction surface 90 *a* of the element 90 to be driven. The friction element F may also be arranged between the holding part 344 and in particular the inner surface 344b of the holding part 344 and the actuator 1.

The drive device K3 may comprise features of the drive device K2 and vice versa.

In case that the actuator 1 is electrically controlled with corresponding voltage signals from a signal generating device V, the drive devices K2 and K3 according to FIGS. 27 to 34 can assume the deformation states of FIGS. 35 and 36 which are calculated using FEM simulations, and by a periodically change from one of these deformation states to the respective other deformation state, a movement of the friction element F can be realized, which can be used to drive an element to be driven which comes into frictional contact therewith.

FIGS. 37 to 39 show a further embodiment of a drive device according to the invention, which is referred to herein with the reference symbol "K4". The drive device K4 comprises two actuators 401 and 402, each of which is realized like the actuator 1 according to FIG. 8 and for which the reference numerals of the same are used. For the longitudinal direction L of the actuators 401, 402, the reference symbols "L401" or "L402" are concretely used. Furthermore, the drive device K4 comprises a holding device 440 which comprises: a receiving part 443 which extends at least in a section transversely to the longitudinal directions L401, L402 for receiving the second actuator end faces FE2 as support surfaces 1b of the actuators 401, 402, a holding part 444 which extends at least in a section transversely to the longitudinal directions L401, L402 for holding the friction element F and for receiving the first control sections A1 or the first actuator end faces FE1 of the actuators 401, 402 and a first and second connecting part 445, 446 which extend along the run in the longitudinal direction L and connect the receiving part 443 and the holding part 444. Here, the friction element F is located on an outer surface 444 *a* of the holding part 444 of the holding device 40 as actuation surface 1 *a*, which is oriented opposite to an inner surface 444b of holding part 444 on which actuator 1 rests. The friction element F extends in a reference or neutral position with its longitudinal direction LF in the longitudinal direction L or along the longitudinal direction L of the actuator 1 towards the friction surface 90 *a* of the element 90 to be driven when the drive device K4 is built in a motor. Due to the position of the actuators 401, 402, a central axis Z of the drive device K4 can be defined, which may run along and in particular in the direction of the longitudinal directions L401, L402 of the actuator 1. The central axis Z can be an axis of symmetry of the holding device 40 or a middle axis of the same.

In the following essentially features are described in which the drive device K4 differs from the drive device K2. On the holding part 444 or the actuation surface 1 *a* of the actuator 1 *a* first end section 445 *a* of a first connection part 445 and a second end portion 446 *a* of a second connection part 446 is located. The receiving part 443, the holding part 444 and the connecting parts 445, 446 form a receiving space 449 in which the actuators 401, 402 are located. The longitudinal directions L401, L402 of the actuators 401, 402 run parallel to one another. In general, the longitudinal direction L401 runs along the longitudinal direction L402. The outer surfaces 445c, 446c of the connecting parts 445, 446, which are oriented opposite to one another, run along the longitudinal directions L401, L402 of the actuators 401, 402 or the central axis Z.

The holding part 444 of the drive device K4 may have any shape and, in the embodiment shown, has the shape of a plate or of a web. A first end portion 447 of the holding part 444 is located above the first end portion 445b and a second end portion 448 of the retaining member 444 is located above the second end portion 446b. Here is the first end portion 447 of the holding part 444, when viewed in the longitudinal direction L401, is located above the first end portion 445b of the first connecting part 445 and the second end portion 448 of the holding part 444, when viewed in the longitudinal direction L402, is located above the second end portion 446b of the second connecting part 446. One or both of the end sections 447, 448 of the holding part 444 can be formed as one piece with the respective end section 445b, 446b or, as shown in FIGS. 37 to 39, can each be connected to the respective end section 445b, 446b via a connecting element 445 *d*, 446d. In particular, the position of the holding part 444 and the position of the receiving part 443 can be provided in such a way that they clamp the actuators 401, 402 in their longitudinal directions L401, L402 and in each case exert a clamping force on the actuators 401, 402 in the form of a compression force that acts along the longitudinal directions L401, L402 of the actuators 401, 402. The first end section 447 of the holding part 444 can be connected to the first end section 445b of the first connecting part 445 by means of an adjusting device. The same may be realized by a connecting element, with which the distance between the first end section 447 of the holding part 444 and the first end section 445b of the first connecting part 445 can be adjusted in order to adjust a clamping force or pressure force which acts on the actuators 401, 402 in the longitudinal directions L401, L402.

In general, the longitudinal directions L401, L402 can be located at a distance from the central axis Z which differs from the value zero. The actuators 401, 402 can be located as a whole in each case laterally and on opposite sides of the central axis Z. In the embodiment of the drive device K4 shown in FIGS. 37 to 39, the longitudinal directions L401, L402 are also symmetrical with respect to the central axis Z. In the embodiment of the drive device K4 shown, the friction element F is centered on the central axis Z.

The drive device K4 may comprise features of the drive device K2 or the drive device K3 and vice versa. Also, the definitions made in relation to the rive device K2 and K3 may be applied to another drive device described herein and in particular to the drive device K4.

In FIGS. 40 and 41, a motor M4 is shown in which the drive device K4 is integrated or built into. The motor comprises the drive device K4, a support device 450 for supporting the drive device K4, an element 90 to be driven and a guide device for guiding the movement of the element 90 to be driven. The drive device K1, the drive device K2 or the drive device K3 or described variants of the same may be, in each case, supported by or integrated in the support device 450 or in described variants thereof.

The support device 450 is realized as a base plate 451 which in particular can have the function of a storage plate or connecting plate. The drive device K4 may be disposed or supported on a section of the support device 450 or of the base plate 451, wherein the section is located at a distance from the friction element F. In this case, the friction element F extends with its longitudinal direction LF in the longitudinal direction L or along the longitudinal direction L of the actuator 1 towards the friction surface 90 a of the element 90 to be driven. As an alternative thereto, it can be provided that the friction element F extends with its longitudinal direction LF transversely to the longitudinal direction L of the actuator 1 towards a friction surface 90 a of the element 90 to be driven. The friction element F can also be disposed between the holding part 444 and in particular between the inner surface 444b of the holding part 444 and the actuator 1.

The support device 450 shown in FIGS. 40 and 41 comprises a pretensioning device 460, which presses the drive device K and thus the friction element F with a defined force against the element 90 to be driven.

The pretensioning device 460 is arranged between the base plate 451 and the drive device K4 and is shaped in such a way that the same presses the friction element F of the drive device K4 against the element 490 to be driven. The pretensioning device 460 of FIG. 40 comprises a first spring leaf 461 which is realized in a central section 462 in a U-shape or in the shape of a trough. At least in a section, the outer surfaces 445c, 446c of the connecting part 445, 446 and an outer surface 444c of the holding part 444 rest on a first outer surface 462 a of the middle section 462 of the same. The middle section 462 may be formed from resilient or dimensionally stable material. The first spring leaf 461 is held on the base plate 451 and may be supported, as shown in FIG. 40, with curved end sections 463, 464 on holders 465, 466 of the base plate 451, wherein the curved end sections 463, 464 are preferably made of an elastic material and adjoin the central section 462 on sides of the same which lie opposite to each other, wherein the holders 465, 466 are, with respect to the central axis Z, located on different sides of the drive device K4. The end sections 463, 464 run at least in a section in directions which deviate from the central axis Z or from the longitudinal directions L401, L402, in order to resiliently hold the first spring leaf 461 on the base plate 451 with the aforementioned flexibility. In particular, as shown in FIG. 29, it can be provided that the end sections 463, 464 at least partially clasp respective holders 465, 466 each of which protrude from the base plate 451 in order to provide the holding function.

Furthermore, the pretensioning device 460 of FIG. 40 may comprise a further holding device for resiliently holding the drive device K4 or the first spring leaf 461 and in particular the second spring leaf 471 shown in FIG. 40. A middle section 472 of the same is U-shaped or shaped as a trough. The middle section 472 can be formed from resilient or dimensionally stable material. The middle section 472 comprises an outer surface 472 a on which, at least in a section, a second outer surface 462b of the middle section 462 of the first spring leaf 461, which is oriented opposite to the first outer surface 462 a of the same, is located, so that the middle section 462 is movable at the second middle section 472 in a direction along the central axis Z or along the longitudinal directions L401, L402. Thereby, the first spring leaf 461 is held on the second spring leaf 471 while providing movability of the first spring leaf 461 along the aforementioned directions. The second spring leaf 471 is held on the base plate 451 and, as shown in FIG. 40, may be held with curved end sections 473, 474 on holders 475, 476 of the base plate 45, wherein the holders 475, 476 are located in each case, when viewed in the central axis Z, on different sides of the drive device K4 and outside of the central portion 462 of the first spring leaf 461d. The end sections 473, 474 run at least in a section in directions which deviate from the central axis Z or from the longitudinal directions L401, L402, in order to provide a resilient holding of the second spring leaf 471 and thus also of the first spring leaf 461 on the base plate 451 with the aforementioned moveability. In particular, as shown in FIG. 40, it may be provided that the end sections 473, 474 at least partially clasp respective holders 475, 476 which protrude from the base plate 451 in order to provide the holding function.

The pretensioning device 460 can also be embodied in other ways. For example, the drive device K4 can be positively locked and supported in a recess in the base plate 461. In this regard, it can be provided that the shape of the recess allows the drive device K4 to move relative to the base plate 461, wherein a spring is additionally acting between the recess and the drive device K4, which presses the drive device K4 against the element 90 to be driven.

The support device 450 can also be realized in a different manner and for example realized as a mounting device so that the motor comprises no pretensioning device. In the motor M with an embodiment of the support device 450 according to the invention, an embodiment of the actuator 1 described herein can be built into or integrated.

The guide device is formed on the base plate 451 and, in particular, provides a guide track which extends transversely to the central axis Z or at least to one of the longitudinal directions L401, L402 run, so that the element 90 to be driven is moveable due to the deformations of the actuator 1 and the movement of the friction element F relative to the base plate 51 transversely to the central axis Z or transversely to at least one of the longitudinal directions L401, L402.

The guide device is in particular arranged stationary relative to the support device 450 as a reference system.

FIGS. 42 to 45 use FE simulations to illustrate the deformation states of the drive device which can be generated due to different electrical control of the actuators of the drive device K4 according to FIGS. 37 to 39.

It can be seen that the drive device K4 or its friction element F can move an element to be driven (not shown in these figures) in two mutually opposite directions, in particular in that only one of the two actuators 401 or 402 is alternately contracted and expanded. In FIG. 42 the actuator 401 is contracted and in FIG. 43 the actuator 401 is expanded. When repeating these actuations, an element to be driven is moved with the movement component in the direction from the actuator 401 to the actuator 402. In FIG. 44, actuator 402 is contracted and in FIG. 45, actuator 402 is expanded. With alternating repetition of these actuations, a driven element is moved with the movement component in the direction of the actuator 402 to actuator 401.

REFERENCE NUMERALS 1 actuator
1 a outer actuation area of the first control section A1
1b support surface
5 reference electrode
10 first outer surface
11 first end face viewed in the longitudinal direction L
12 second end face
15 first control electrode
16 first connection section of the first outer surface 10
20 second outer surface
21 first end face
22 second end face located opposite to the first end face 21
25 second control electrode
26 second connection section of the second outer surface 20

30 third outer surface
31 first end face
32 second end face
35 third control electrode
40 holding device
41 tensioning frame
43 receiving part
44 holding part
45, 46 connecting parts
47 receiving space
50 support device
51 base plate
57 recess of the base plate 51
60 pretensioning device
64 plate
65 first end section
66 second end section
90 element to be driven
90a friction surface
95 guide device
140 holding device
141 tensioning frame
143 receiving part
144 holding part
144a outer surface of the holding part 144
144b inner surface of the holding part 144
145, 146 connecting parts
145a, 145b end sections
145c, 146c outer surfaces
145d, 146d connecting elements
147 first end section of the holding part 144
148 second end section of the holding part 144
149 receiving space
240 holding device
241 tensioning frame
243 receiving part
244 holding part
244a outer surface of the holding part 244
244b inner surface of the holding part 244
245, 246 connecting parts
245a, 245b end sections
245c, 246c outer surfaces
245d connecting element
247 first end section of the holding part 144
248 second end section of the holding part 144
249 receiving space
401, 402 actuators
440 holding device
443 receiving part
444 holding part
444c outer surface of the holding part 444
445, 446 connecting part
445c, 446c outer surfaces
445a first end section
446a second end section
447 end section
448 end section
449 receiving space
450 support device
451 base plate
460 pretensioning device
461 first spring leaf
462 middle section
462a first outer surface of the middle section 462
462b second outer surface of the middle section 462
463, 463 end sections
465, 466 holders of the base plate 451
471 second spring leaf
472 middle section
472a outer surface of the middle section 472
473, 474 end sections
475, 476 holder of the base plate 451
A1, A2, A3 control section
D1, D2, D3 deformation body
E1 excitation electrode
E2 common electrode
F friction element
FE1, FE2 actuator end faces
V, V1, V2 signal generating devices
G1, G2 signal section groups
K, K1, K2, K3, K4 drive devices
L longitudinal direction of actuator 1
L401, L402 longitudinal direction of actuator 401 or 402
LF longitudinal direction of the friction element F
M, M1, M4 motor
S10 first voltage signal
S11 rising signal flank
S12 signal flank
S13 intermediate section
S20 second voltage signal
S21 signal section
S22 signal section
SA1 first signal section
SA2 second signal section
tz time interval
Z central axis

The invention claimed is:

1. A method for operating an electromechanical element, comprising the following steps:
by controlling a first control section, which is deformable by an electrical voltage, with a first voltage signal generation of adjusting movements of a friction element which is arranged on the electromechanical element and which is provided for frictional contact with an element to be driven, wherein the first voltage signal comprises a plurality of signal flanks which rise according to absolute amount and signal flanks which decrease according to absolute amount over time, wherein the increasing signal flanks and the decreasing signal flanks which alternate with each other in terms of time, wherein after an increasing signal flank and before a subsequent decreasing signal flank, or vice versa, an intermediate signal section with a non-zero time interval (tz) which differs over time from the shape of the signal flanks and preferably comprise a time-dependent gradient,
controlling of a second control section which is deformable by an electrical voltage by a second voltage signal, which comprises a signal section, the frequency of which compared to the first voltage signal is by a factor of at least 10 higher and begins in terms of time within the time interval tz of the intermediate signal section of the first voltage signal and extends at least partially over the signal flank which in terms of time follows the signal intermediate section.

2. The method according to claim 1, wherein the intermediate signal section comprises a time-dependent gradient, which amounts to a maximum of 10 degrees.

3. The method according to claim 1, wherein the signal section of the second voltage signal begins after at least 10% and at most 90% of the time interval tz of the intermediate signal section (S13) has elapsed or 50% of the time interval before the end of the same.

4. The method according to claim 1, wherein the signal section of the second voltage signal extends into an adjacent and temporally subsequent intermediate signal section and within its time interval tz or ends until its end.

5. The method according to claim 1, wherein the signal section of the second voltage signal is sinusoidal.

6. The method according to claim 1, wherein the maximum amplitude of the signal section of the second voltage signal is at most 50% of the maximum amplitude of the first voltage signal.

7. The method according to claim 1,
wherein the controlling of the first control section is a simultaneous control of a plurality of first control sub-sections with the first voltage signal, wherein the first control sub-sections form the first control section and are located one behind the other in a longitudinal direction,
wherein the controlling of the second control section is a simultaneous control of several second control sub-sections with the second voltage signal, wherein the second control sub-sections form the second control section and are located one behind the other in the longitudinal direction.

8. The method according to claim 1, wherein simultaneously with the controlling of the first control section, a third control section which is deformable by an electrical voltage is controlled with the first voltage signal, wherein the third control section is arranged such that the second control section is located between the first and the third control section.

9. The method according to claim 8, wherein the controlling of the third control section is a simultaneous control of a plurality of third control sub-sections with the first voltage signal, wherein the third control sub-sections form the third control section and are located one behind the other in the longitudinal direction.

10. An actuator, suitable for using the method according to claim 1, comprising:
a first control section which extends in a longitudinal direction and is deformable by an electrical voltage and comprises: a first deformation body, which is delimited by a first outer surface and two end faces which are lying opposite to each other, between which the first outer surface extends along the longitudinal direction, and two actuation electrodes which extend transversely to the longitudinal direction electrodes, wherein one actuation electrode acts as an excitation electrode and is disposed at the first end face and wherein another actuation electrode acts as a common electrode and is disposed at the second end face,
a second control section which extends in a longitudinal direction and is deformable by an electrical voltage and comprises: a second deformation body, which is disposed in the longitudinal direction at the first deformation body, wherein the second deformation body is delimited by a second outer surface and two end faces which are lying opposite to each other, between which the first outer surface extends along the longitudinal direction, and two actuation electrodes which extend transversely to the longitudinal direction electrodes, wherein one actuation electrode acts as an excitation electrode and is disposed at the first end face and wherein another actuation electrode acts as a common electrode and is disposed at the second end face,
a first control electrode which is disposed at a first connection section of the first outer surface and which is electrically connected to the excitation electrode of the first control section,
a second control electrode which is electrically separated from the first control electrode, which is disposed at a second connection section of the second outer surface and which is electrically connected to the excitation electrode of the second control section,
a reference electrode which is disposed at the first outer surface and the second outer surface and separated from the first control electrode and separated from the second control electrode and which is electrically connected to the common electrodes of the first and the second deformation body.

11. The actuator according to claim 10, wherein the actuator further comprises:
a third control section which extends in a longitudinal direction and is deformable by an electrical voltage and which is located at a side of the second control section, wherein this side is located opposite of the side of the first control section with respect to the longitudinal direction, and wherein the third control section comprises:
a third deformation body which is delimited by a third outer surface and two end faces which are lying opposite to each other, between which the third outer surface extends along the longitudinal direction, and two actuation electrodes which extend transversely to the longitudinal direction, wherein one actuation electrode acts as an excitation electrode and is disposed at the first end face and wherein another actuation electrode acts as a common electrode and is disposed at the second end face, and
a third control electrode which is disposed at a third outer surface of the third connection section of the is arranged and which is electrically connected to the excitation electrode of the third control section,
wherein the reference electrode is additionally disposed at the third outer surface of the third deformation body and separated from the third control electrode and separated from the second control electrode and which is electrically connected to the common electrode of the third deformation body.

12. The actuator according to claim 11, wherein the third control electrode is formed in one piece with the first control electrode.

13. The actuator according to claim 10, wherein at least one of the first and second control sections is formed of a sequence of several control sub-sections, wherein each of the control sub-sections is formed of a plate-shaped excitation electrode which extends transversely to the longitudinal direction, of a plate-shaped common electrode which extends transversely to the longitudinal direction and of a layer which is located between these in the longitudinal direction and is made of an electromechanical material, in particular piezoelectric material, wherein the layer is respectively located between the excitation electrode and the common electrode.

14. The actuator according to claim 10, wherein at least one of the first and second deformation bodies is formed from a homogeneous and electrically deformable material.

15. The actuator according to claim 10, wherein a friction element is disposed at an end section of the first control section or the second control section oriented in the longitudinal direction.

16. A drive device (K) with the actuator according to claim 10 and a holding device which is formed at least partially elastically, wherein the actuator is held in the holding device and preferably clamped therein.

17. The drive device (K) according to claim 16, wherein the holding device is realized as a tensioning frame which surrounds the actuator at least in sections.

18. A motor with the drive device according to claim 16 and with an element (90) to be driven, which is supported so as to be movable relative to the drive device and which is in frictional contact with a friction element which is disposed at the actuator.

* * * * *